US012738332B2

(12) United States Patent
Kim et al.

(10) Patent No.: US 12,738,332 B2
(45) Date of Patent: Sep. 15, 2026

(54) MEMORY DEVICE WITH IMPROVED THRESHOLD VOLTAGE DISTRIBUTION AND OPERATING METHOD THEREOF

(71) Applicant: Samsung Electronics Co., Ltd., Suwon-si (KR)

(72) Inventors: Joonam Kim, Suwon-si (KR); Sejun Park, Suwon-si (KR); Kangin Shin, Suwon-si (KR); Changhwan Shin, Suwon-si (KR); Hyeji Lee, Suwon-si (KR); Woojae Jang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 74 days.

(21) Appl. No.: 18/338,857

(22) Filed: Jun. 21, 2023

(65) Prior Publication Data

US 2024/0161842 A1 May 16, 2024

(30) Foreign Application Priority Data

Nov. 10, 2022 (KR) ........................ 10-2022-0149351

(51) Int. Cl.
*G11C 16/34* (2006.01)
*G11C 16/10* (2006.01)

(52) U.S. Cl.
CPC ........ *G11C 16/3459* (2013.01); *G11C 16/102* (2013.01)

(58) Field of Classification Search
CPC .......................... G11C 16/102; G11C 16/3459
(Continued)

(56) References Cited

U.S. PATENT DOCUMENTS 7,679,133 B2 3/2010 Son et al.
8,553,466 B2 10/2013 Han et al.
(Continued)

FOREIGN PATENT DOCUMENTS

KR 10-2011-0006137 A 1/2011
KR 10-2016-0129430 A 11/2016
(Continued)

OTHER PUBLICATIONS

Office Action issued Jul. 15, 2026 in Korean Application No. 10-2022-0149351.

*Primary Examiner* — Anthan Tran
(74) *Attorney, Agent, or Firm* — Harness, Dickey & Pierce, P.L.C.

(57) ABSTRACT

Provided is a memory device with improved threshold voltage distribution and an operating method of the memory device. The memory device includes a memory cell array including a plurality of memory cells, a voltage generator configured to generate a program voltage and a verification voltage applied to the plurality of memory cells during a data write operation, and a control logic configured to control multiple program loops to program the memory cells to multiple program states during the data write operation and configured to determine whether programming passes or fails in the multiple program loops, wherein the control logic controls the program loops to verify one or more (n+1)-th memory cells to be programmed to an (n+1)-th program state by using a verify condition for verifying an n-th program state in at least one of the multiple program loops (n is an integer greater than or equal to 1).

10 Claims, 17 Drawing Sheets

(58) Field of Classification Search
USPC .................................................... 365/185.22
See application file for complete search history.

(56) References Cited

U.S. PATENT DOCUMENTS

| | | | | |
|---|---|---|---|---|
| 8,559,235 | B2 | 10/2013 | Yoon et al. | |
| 8,638,608 | B2 | 1/2014 | Lai et al. | |
| 8,654,587 | B2 | 2/2014 | Yoon et al. | |
| 8,687,427 | B2 | 4/2014 | Roobparvar | |
| 8,942,046 | B2 | 1/2015 | Kwak | |
| 9,761,314 | B2 | 9/2017 | Lee et al. | |
| 10,354,735 | B2 | 7/2019 | Tanaka et al. | |
| 2004/0109352 | A1* | 6/2004 | Lee | G11C 16/3454 365/185.2 |
| 2011/0233648 | A1 | 9/2011 | Seol et al. | |
| 2014/0025866 | A1* | 1/2014 | Kim | G11C 16/10 711/103 |
| 2017/0154677 | A1* | 6/2017 | Lim | G11C 16/3459 |
| 2017/0330632 | A1 | 11/2017 | Shim et al. | |
| 2021/0027849 | A1 | 1/2021 | Park et al. | |

FOREIGN PATENT DOCUMENTS

| | | | |
|---|---|---|---|
| KR | 10-2018-0029430 | A | 3/2018 |
| KR | 10-1915719 | B1 | 1/2019 |

* cited by examiner 300
530
501
510
520
531
532
533
534
535
536
537
538
THV
550c
560c
592
572d
672d
652
615
610
601
CH
BLBA
WLBA
PA
540
541
542
543
544
545
546
547
620c
593
672c
640c
630c
671c
572c
594
671b
672b
620b
630b
640b
605
603
630a
640a
620a
505
503
550b
560b
571b
572b
580
550a
560a
571a
572a
673a
672a
CELL
(L1)
PERI
(L2)
VD
HD1
HD2

MEMORY DEVICE WITH IMPROVED THRESHOLD VOLTAGE DISTRIBUTION AND OPERATING METHOD THEREOF

CROSS-REFERENCE TO RELATED APPLICATION

This application is based on and claims priority under 35 U.S.C. § 119 to Korean Patent Application No. 10-2022-0149351, filed on Nov. 10, 2022, in the Korean Intellectual Property Office, the disclosure of which is incorporated by reference herein in its entirety.

BACKGROUND

The inventive concepts relate to a memory device, and more particularly, to a memory device with improved threshold voltage distribution and an operating method of the memory device.

Flash memory devices that are nonvolatile memory devices may retain the stored data even when power is cut off. Storage devices including the flash memory devices, such as solid state drives (SSDs) and memory cards are widely used, and the storage devices are usefully used to store or move large amounts of data.

Multiple program loops may be performed in writing data to the nonvolatile memory device. In this case, a program operation and a verification operation may be performed in multiple program loops, and the program operation may be performed by an incremental step pulse programming (ISPP) method. In addition, a high speed program (HSP) may be used as an example of a program method, and as data of multiple bits is stored in each memory cell of a nonvolatile memory device, threshold voltage distribution characteristics of memory cells are required to be improved.

SUMMARY

The inventive concepts provide a memory device that may improve a threshold voltage distribution in a program operation of, for example, a high speed program (HSP) method, and an operating method of the memory device.

According to an aspect of the inventive concepts, a memory device includes a memory cell array including a plurality of memory cells, a voltage generator configured to generate a program voltage and a verification voltage; and a control logic configured to control multiple program loops to program the memory cells, using the program voltage, to multiple program states during a data write operation and to determine, using the verification voltage, whether programming passes or fails in the multiple program loops, wherein the control logic is configured to control the program loops to verify one or more (n+1)-th memory cells to be programmed to an (n+1)-th program state using a verification condition for verifying an n-th program state in at least one of the multiple program loops, and wherein n is an integer greater than or equal to 1.

According to another aspect of the inventive concepts, an operating method of a memory device including a plurality of memory cells includes performing a first programming of one or more n-th memory cells to an n-th program state and of one or more (n+1)-th memory cells to an (n+1)-th program state; inhibiting a program operation for the n-th memory cells when the first programming of the n-th memory cells is completed; and performing a second programming of the one or more (n+1)-th memory cells, wherein the first programming includes one or more first program loops, and in each of the first program loops, whether programming of the n-th memory cells and the (n+1)-th memory cells pass or fail is verified using a verification voltage of a first level for verifying the n-th program state, and the second programming includes one or more second program loops, and in each of the second program loops, whether programming of the (n+1)-th memory cells passes or fails is verified using a verification voltage of a second level for verifying the (n+1)-th program state.

According to another aspect of the inventive concepts, a memory device includes a memory cell array including a memory cell array including a plurality of memory cells; a voltage generator configured to generate a program voltage and a verification voltage applied to the plurality of memory cells during a data write operation; and a control logic configured to change levels of threshold voltages of the plurality of memory cells to multiple threshold voltage distributions by controlling program loops for the plurality of memory cells during the data write operation, and program one or more (n+1)-th memory cells to be programmed to an (n+1)-th program state by setting an n-th program state as a target distribution, and then to control the program loops to program the (n+1)-th memory cells by setting the (n+1)-th program state as another target distribution.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Hereinafter, embodiments of the inventive concepts will be described in detail with reference to the accompanying drawings. It will be understood that the orientation of the accompanying drawings and the spatially relative terms, such as "vertical," "above", "top", etc. used herein, are intended to encompass different orientations of the device in use or operation in addition to the orientation depicted in the figures, and that the device may be otherwise oriented (rotated 90 degrees or at other orientations) and the spatially relative terms used herein interpreted accordingly.

Although the terms "first," "second," "third," etc., may be used herein to describe various elements, components, regions, layers, and/or sections, these elements, components, regions, layers, and/or sections, should not be otherwise limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

Functional terms such as those including "logic", and/or ". . . er/or" described in the specification represent units that process at least one function or operation, and may be implemented as processing circuitry such as hardware, software, or a combination of hardware and software. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc., and/or electronic circuits including said components.

Figure 1:
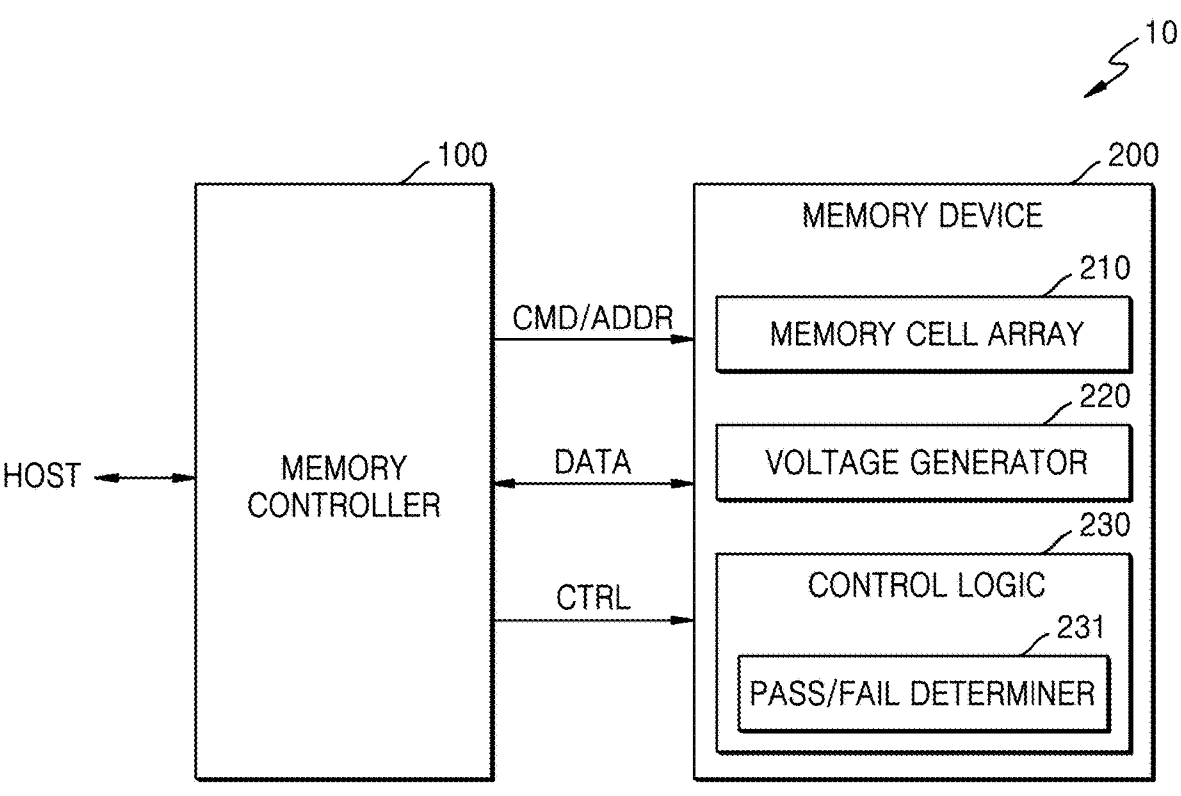
FIG. 1 is a block diagram illustrating a memory system according to at least one example embodiment of the inventive concepts.

FIG. 1 is a block diagram illustrating a memory system according to at least one example embodiment of the inventive concepts.

Referring to FIG. 1, a memory system 10 may include a memory controller 100 and a memory device 200. The memory device 200 may include a memory cell array 210, a voltage generator 220, and a control logic 230; and the control logic 230 may include a pass/fail determiner 231. Although the pass/fail determiner 231 is illustrated as being included in the control logic 230 in the example of FIG. 1, the pass/fail determiner 231 according to an embodiment of the inventive concepts may be implemented as a separate component outside the control logic 230. In addition, the pass/fail determiner 231 may perform functions, according to at least one embodiment of the inventive concepts, by using various methods and may be implemented by, for example, a hardware circuit, software that may be executed by a processor, and/or a combination thereof.

According to at least one example embodiment, the memory system 10 may communicate with a host HOST through various interfaces, and for example, the memory system 10 may communicate with the host HOST through various interfaces, such as a Universal Serial Bus (USB) interface, a multimedia card (MMC) interface, an embedded MMC (eMMC) interface, a peripheral component interconnection (PCI) interface, a PCI-express (PCI-E) interface, an advanced technology attachment (ATA) interface, a serial-ATA interface, a parallel-ATA interface, a small computer small interface (SCSI), an enhanced small disk interface (ESDI), an integrated drive electronics (IDE) interface, a firewire interface, a universal flash storage (UFS) interface, a nonvolatile memory express (NVMe) interface, and/or the like.

According to at least one example embodiment, the memory device 200 may include a nonvolatile memory device. In some embodiments, the memory system 10 may be implemented by a memory that may be embedded in or removable from an electronic device. For example, the memory system 10 may be implemented in various forms, such as an embedded universal flash storage (UFS) memory device, an eMMC, a solid state drive (SSD), a UFS memory card, a compact flash (CF) memory card, a secure digital (SD) card, a micro secure digital (Micro-SD) card, a mini secure digital (Mini-SD), an extreme digital (xD) card, a memory stick, and/or the like.

The memory controller 100 may control the memory device 200 to read data stored in the memory device 200 or write (or program) data to the memory device 200 in response to a read/write request from the host HOST. For example, the memory controller 100 may control a write operation, a read operation, and an erase operation of the memory device 200 by providing an address ADDR, a command CMD, and a control signal CTRL to the memory device 200. In addition, data DATA to be stored in the memory device 200 and data DATA read from the memory device 200 may be transmitted and received between the memory controller 100 and the memory device 200.

The memory cell array 210 may include a plurality of memory cells, and for example, the plurality of memory cells may be a plurality of flash memory cells. Hereinafter, embodiments of the inventive concepts are described in detail by taking a case in which the plurality of memory cells are a plurality of NAND flash memory cells as an example. However, the inventive concepts is not limited thereto, and in some embodiments, the plurality of memory cells may be a plurality of resistive memory cells having resistance distributions, such as resistive random access memory (ReRAM) cells, phase change RAM (PRAM) cells, magnetic RAM (MRAM) cells, and/or the like.

In at least one embodiment, the memory cell array 210 may include a three-dimensional (3D) memory cell array, and the 3D memory cell array may include a plurality of NAND strings, and each of the NAND strings may include memory cells respectively connected to word lines vertically stacked on a substrate. U.S. Pat. Nos. 7,679,133, 8,553,466, 8,654,587, 8,559,235, and U.S. Patent Application Publication No. 2011/0233648 disclose in detail a suitable configuration for a 3D memory array which consists of a plurality of levels and in which word lines and/or bit lines are shared between the plurality of levels, which are incorporated herein in their entirety by reference. However, the inventive concepts is not limited thereto, and in some embodiments, the memory cell array 210 may include a two-dimensional (2D) memory cell array, and the 2D memory cell array may include a plurality of NAND strings arranged in a row direction and a column direction.

When a write command requesting write is provided to the memory device 200 from the memory controller 100, a write operation may be performed under control by the control logic 230. The write operation may be performed through multiple program loops, and in each of the program loops, a program operation using a program voltage and a verification operation using a verification voltage may be performed to change (or increase) a threshold voltage level. In addition, when the program operation is performed by using an incremental step pulse programming (ISPP) method, gradually increasing voltage pulses may be provided to memory cells to be programmed. Alternatively, in at least one example embodiment, the verification operation may also be selectively performed only in some of the multiple program loops.

In at least one example embodiment of the inventive concepts, when a high speed program (HSP) method is applied, voltage pulses may be provided together to memory cells to be programmed to another program state in one program loop. For example, threshold voltage levels of first memory cells to be programmed to a first state P1 having a relatively low threshold voltage level and threshold voltage levels of n-th memory cells to be programmed to an n-th state Pn having a relatively high threshold voltage level may be increased together by the voltage pulses, and when programming of the first memory cells is completed (e.g., when a programming of the first memory cells is determined as program pass), a program operation on the first memory cells is inhibited, and program loops may be further performed on the n-th memory cells.

When an HSP method is applied, a level of a voltage pulse according to ISPP may be gradually increased through a plurality of program loops in programming a plurality of memory cells. In this case, a relatively large number of program operations may be performed, on the n-th memory cells to be programmed to the n-th state Pn having a relatively high threshold voltage level, through voltage pulses having continuously increasing levels. Accordingly, a threshold voltage level of the n-th memory cells may be excessively increased or a width of the threshold voltage distribution may be increased, which causes a reduction in reliability of data in a flash memory in which multiple bits are stored in respective memory cells.

In at least one example embodiment of the inventive concepts, during programming, an operation of collecting at least two adjacent programs states or at least two program states that are not adjacent to each other into one threshold voltage distribution is performed. For example, by applying a verification operation under the same verification condition (for example, the same or substantially similar verification voltage) to memory cells to be programmed to another program state, the memory cells to be programmed to another program state during programming may be collected in one threshold voltage distribution, and accordingly, threshold voltage levels of the memory cells to be programmed to another program state during the programming may have the same or similar value during a partial time period. For example, as the verification operation is performed on the (n+1)-th memory cells to be programmed to the (n+1)-th state Pn+1 under the same condition as the n-th memory cells to be programmed to the n-th state Pn in at least some of the plurality of program loops, the (n+1)-th memory cells may be programmed to a threshold voltage distribution corresponding to the n-th state Pn. In addition, after the threshold voltage distribution of the (n+1)-th memory cells reaches the n-th state Pn, program loops may be performed such that the threshold voltage distribution of the (n+1)-th memory cells is in the (n+1)-th state Pn+1 corresponding to a target distribution.

According to at least one example embodiment of the inventive concepts described above, a verification operation for the (n+1)-th memory cells to be programmed to the (n+1)-th state Pn+1 may be performed by using a verification level for verifying the n-th state Pn in at least one program loop. After at least one program loop using the verification condition of the n-th state Pn is performed, a verification operation for the (n+1)-th memory cells may be performed by using a verification level for verifying the (n+1)-th state Pn+1. Accordingly, the pass/fail determiner 231 may determine whether the programming of the (n+1)-th memory cells (to be programmed to the (n+1)-th state Pn+1) passed or failed, based on the verification condition of the n-th state Pn and the verification condition of the (n+1)-th state Pn+1.

Meanwhile, the voltage generator 220 may generate various voltages used in the memory device 200, and may generate, for example, a program voltage (for example, voltage pulses) for a program operation and an inhibit voltage provided to word lines or bit lines to inhibit programming of memory cells determined to be program pass. In addition, the voltage generator 220 may further generate a verification voltage used in a verification operation of verifying a program operation.

The control logic 230 may control all operations of the memory device 200 and may output various internal control signals for programming data into the memory cell array 210 or reading data from the memory cell array 210, based on, for example, the command CMD, the address ADDR, and the control signal CTRL received from the memory controller 100. In addition, the control logic 230 may also output a voltage control signal (not illustrated) for adjusting levels of various voltages output from the voltage generator 220 in relation to a program operation, a read operation, and an erase operation.

According to the example described above, a pass/fail determination method for a certain threshold voltage distribution may be improved, and accordingly, it is possible to improve the degradation of threshold voltage distribution characteristics caused by a relatively large number of program loops being performed by using voltage pulses with high levels in an HSP method. In addition, as described below, the speed of a data write operation may be increased by diversifying program states for verification under the same verification condition.

Figure 2:
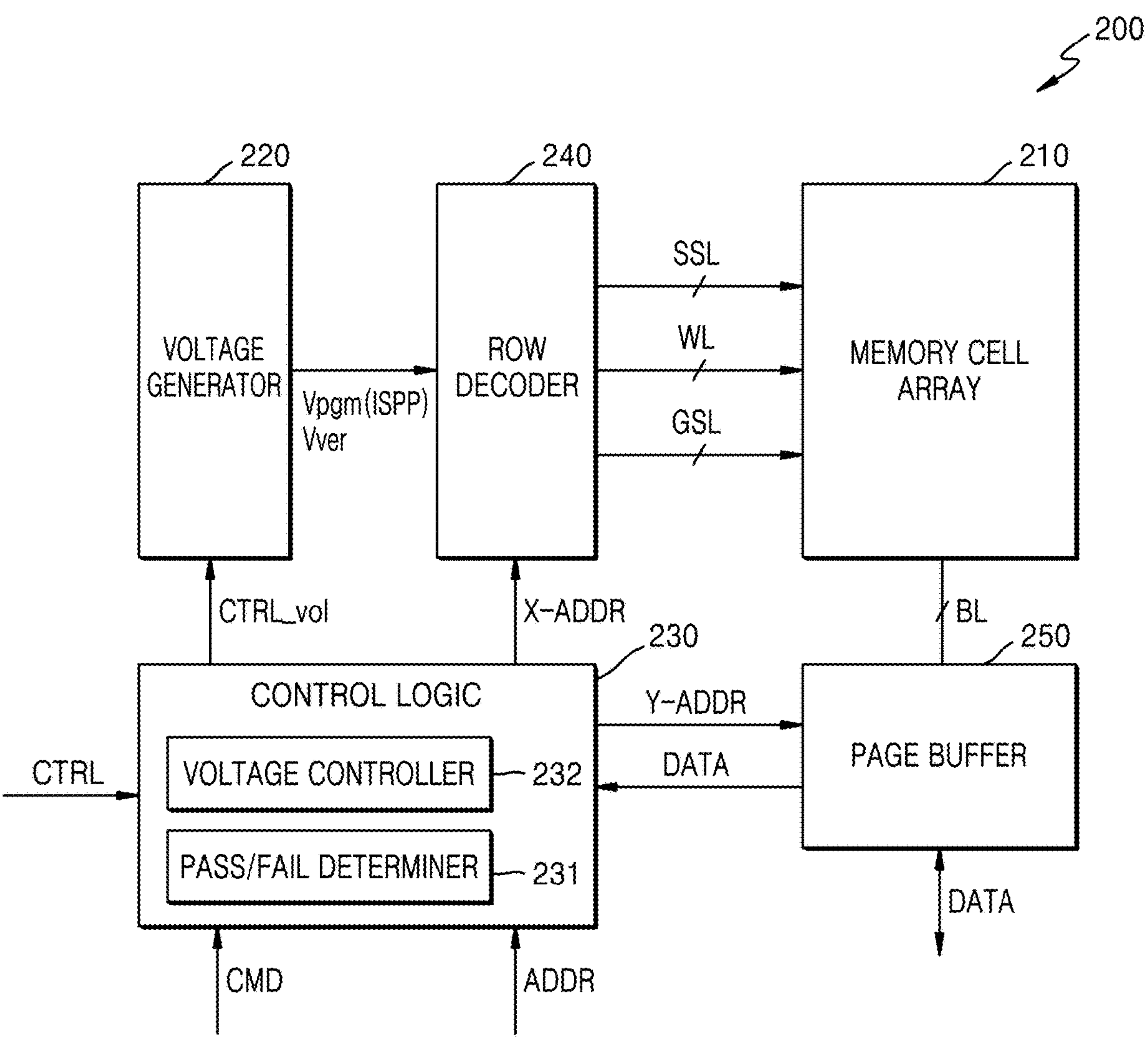
FIG. 2 is a block diagram illustrating an implementation example of the memory device of FIG. 1.

FIG. 2 is a block diagram illustrating an implementation example of the memory device of FIG. 1.

Referring to FIGS. 1 and 2, the memory device 200 may include the memory cell array 210, the voltage generator 220, the control logic 230, a row decoder 240, and a page buffer 250. In addition, the control logic 230 may include the pass/fail determiner 231 and a voltage controller 232. Although not illustrated in FIG. 2, the memory device 200 may further include various other components relating to memory operations, such as a data input/output circuit, an input/output interface, and/or the like.

The memory cell array 210 may include a plurality of memory blocks and may be connected to word lines WL, string select lines SSL, ground select lines GSL, and bit lines BL. The memory cell array 210 may be connected to the row decoder 240 through the word lines WL, the string select lines SSL, and the ground select lines GSL and may be connected to the page buffer 250 through the bit lines BL. Each memory cell may store one or more bits. For example, in at least one embodiment, each memory cell may correspond to a multi-level cell (MLC), a triple level cell (TLC), a quad level cell (QLC), and/or the like.

The control logic 230 may output various internal control signals for programming data into the memory cell array 210 or reading data from the memory cell array 210, based on the command CMD, the address ADDR, and the control signal CTRL received from the memory controller 100. The control logic 230 may output a voltage control signal CTRL_vol for controlling levels of various voltages generated by the voltage generator 220. In addition, FIG. 2 illustrates that the pass/fail determiner 231 and the voltage controller 232 are included in the control logic 230. However, embodiments of the inventive concepts are not limited thereto, and at least some of the components constituting the pass/fail determiner 231 and the voltage controller 232 may be provided outside (or separate from) the control logic 230.

The control logic 230 may provide a row address X-ADDR to the row decoder 240 and may provide a column address Y-ADDR to the page buffer 250. During a program operation and a verification operation, the row decoder 240 may provide a program voltage Vpgm and a verification voltage Vver to the word lines in response to the row address X-ADDR, and according to the example described above, the program voltage Vpgm may include a voltage pulse based on ISPP.

According to at least one example embodiment of the inventive concepts, the pass/fail determiner 231 may use verification conditions for verifying other program states in determining pass/fail during a verification operation for one or more (n+1)-th memory cells to be programmed to a preset program state (for example, (n+1)-th state Pn+1). For example, the pass/fail determiner 231 may determine whether the program pass/fail for the (n+1)-th memory cells by using the verification voltage Vver for verifying the n-th state Pn. Accordingly, the (n+1)-th memory cells may have a distribution corresponding to the n-th state Pn in the process of changing a threshold voltage level, and program loops may be controlled to be changed to a target distribution corresponding to the (n+1)-th state Pn+1 at a preset (or otherwise determined) timing. In at least one example embodiment, the timing may be set according to various methods, and for example, after programming of the n-th memory cells is completed, the (n+1)-th memory cells may be verified by using the verification voltage Vver for verifying the (n+1)-th state Pn+1. Alternatively, the (n+1)-th memory cells may be verified using the verification voltage Vver for verifying by the (n+1)-th state Pn+1 after a certain timing (or any one of the program loops for the n-th memory cells) before programming of the n-th memory cells is completed.

Meanwhile, although the above example described that the verification operation corresponds to an operation of determining data based on a level of the verification voltage Vver, the embodiments of the inventive concepts are not limited thereto. For example, the verification operation may also be performed in various ways, such as setting a level of a current used in the verification operation or setting data sensing timing.

Meanwhile, the pass/fail determiner 231 may receive data DATA through the page buffer 250 and may determine whether programming passes or fails based on a result of determining a logic state of the data DATA. In at least one example embodiment of the inventive concepts, in at least one program loop, programming of the (n+1)-th memory cells may be determined to pass, even though threshold voltage levels of the (n+1)-th memory cells are lower than a voltage level that is a reference for determining pass of the (n+1)-th state Pn+1.

According to the above operation, even though the (n+1)-th memory cells do not reach a target distribution, a program operation for the (n+1)-th memory cells may be inhibited in at least one program loop among the plurality of program loops. In addition, the program operation for the (n+1)-th memory cells may be performed again at a preset (and/or otherwise determined) point in time or at a certain point in time, and while one or more program loops are performed, threshold voltage levels of the (n+1)-th memory cells may change to a target distribution.

Meanwhile, the page buffer 250 may operate as a write driver or a sense amplifier depending on operation modes. The page buffer 250 may include a plurality of buffer units connected to a plurality of bit lines BL. Each of the buffer units may include one or more latches that store read data through a corresponding bit line. In one operation example, at least one latch included in the buffer unit may correspond to a latch (for example, a first latch) that stores information for inhibiting programming of a corresponding memory cell. In at least one example embodiment of the inventive concepts, when the (n+1)-th memory cells are determined to program pass by using the verification voltage Vver for verifying the n-th state Pn, information stored in the first latch of the buffer unit corresponding to the (n+1)-th memory cells is changed from a first value to a second value, and accordingly, a program operation of the (n+1)-th memory cells may be inhibited.

Figure 3A:
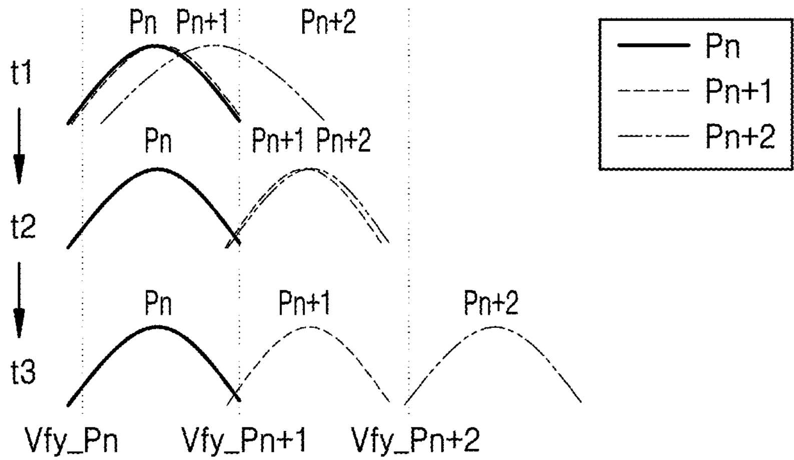
FIGS. 3A and 3B are diagrams illustrating threshold voltage distributions according to at least one example embodiment of the inventive concepts.
Figure 3B:
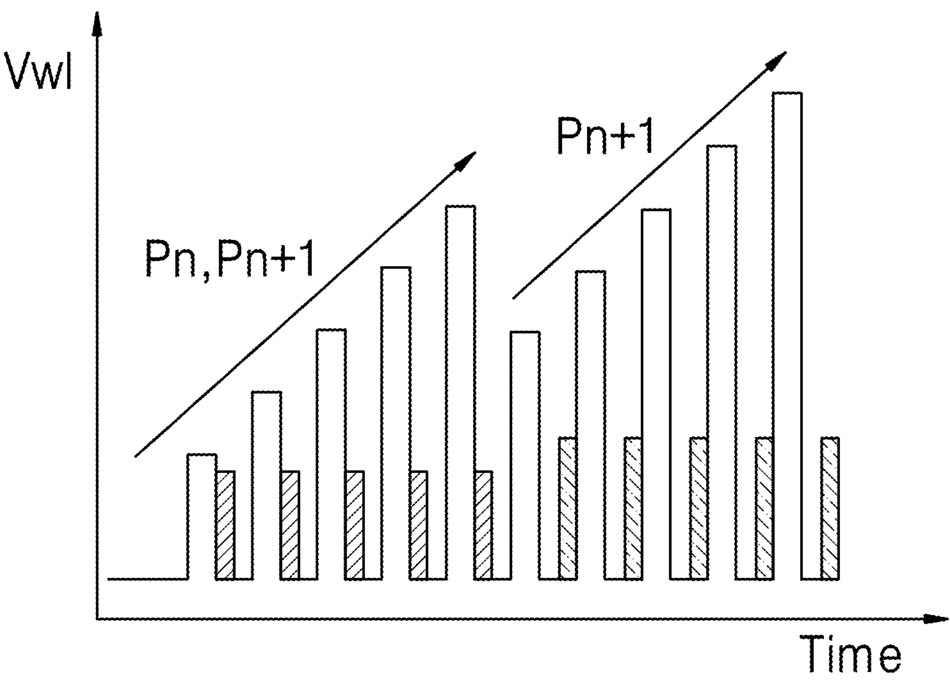

FIGS. 3A and 3B are diagrams illustrating threshold voltage distributions according to at least one example embodiment of the inventive concepts. FIGS. 3A and 3B illustrate threshold voltage distributions of the n-th memory cells to be programmed to the n-th states Pn to (n+2)-th memory cells to be programmed to a (n+2)-th state Pn+2. In addition, the embodiments of FIGS. 3A and 3B illustrate a case in which threshold voltage levels of two adjacent program states are controlled to have the same or similar value during programming.

As the program loop progresses, the (n+1)-th memory cells may be verified based on a verification voltage Vfy_Pn of the n-th state Pn, and accordingly, a threshold voltage distribution of the n-th memory cells and the (n+1)-th memory cells at a first point in time t1 may be located identically or similarly to the n-th state Pn. In addition, the (n+2)-th memory cells may be verified based on a verification voltage Vfy_Pn+1 in the (n+1)-th state Pn+1 such that the threshold voltage distribution of the (n+2)-th memory cells is located identically or similarly to the (n+1)-th state Pn+1.

Thereafter, the (n+1)-th memory cells may be verified based on the verification voltage Vfy_Pn+1 in the (n+1)-th state Pn+1, and accordingly, threshold voltage levels of the (n+1)-th memory cells increase. In addition, the (n+2)-th memory cells may be verified based on the verification voltage Vfy_Pn+1 in the n-th state Pn+1, and accordingly, at a second point in time t2, threshold voltage distributions of the (n+1)-th memory cells and the (n+2)-th memory cells may be located identically or similarly to the (n+1)-th state Pn+1. Thereafter, the (n+2)-th memory cells may be verified based on the verification voltage Vfy_Pn+2 in the (n+2)-th state Pn+2, and accordingly, threshold voltage levels of the (n+2)-th memory cells increase, and at a third point in time t3, a threshold voltage distribution of the (n+2)-th memory cells may change to the (n+2)-th state Pn+2 corresponding to a target distribution.

FIG. 3B illustrates an example of a program voltage and a verification voltage for the program operation illustrated in FIG. 3A.

Referring to FIG. 3B, as program loops progress, levels of voltage pulses may gradually increase as voltages Vwl provided to word lines. In one operation example, while program loops are performed on the n-th memory cells to be programmed to the n-th state Pn during multiple program loops, the (n+1)-th memory cells to be programmed to the (n+1)-th state Pn+1 may be programmed together, and the n-th memory cells and the (n+1)-th memory cells may be verified based on the same verification voltage Vfy_Pn.

As the programming of the n-th memory cells is completed, the programming of the n-th memory cells is inhibited, and program loops for programming the (n+1)-th memory cells to the (n+1)-th state Pn+1 corresponding to a target distribution may be performed. In this case, in at least one example embodiment, program loops may be performed in a manner of gradually increasing levels again after levels of voltage pulses are reduced by a preset value, and accordingly, the voltage levels are controlled such that the threshold voltage levels are not excessively increased at the timing when programming to the (n+1)-th state Pn+1 starts, and thus, a change in the threshold voltage level may be precisely adjusted.

Meanwhile, as a process of changing the threshold voltage distribution of the (n+1)-th memory cells to a target distribution is performed, the (n+1)-th memory cells may be verified based on the verification voltage Vfy_Pn+1 for verifying the (n+1)-th state Pn+1 during the program loops. Although not illustrated in FIG. 3B, the second memory cells to be programmed to the (n+2)-th state Pn+2 adjacent to the (n+1)-th state Pn+1 may be verified based on the verification voltage Vfy_Pn+1 for verifying the (n+1)-th state Pn+1 during at least one program loop, and accordingly, a threshold voltage distribution of the (n+2)-th memory cells may be located identically or similarly to the (n+1)-th state Pn+1. The example embodiments are not limited to the number of voltage pulses illustrated. For example, the programming loops of the example embodiments may include more, or fewer, of the voltage pulses than is illustrated.

Figure 4:
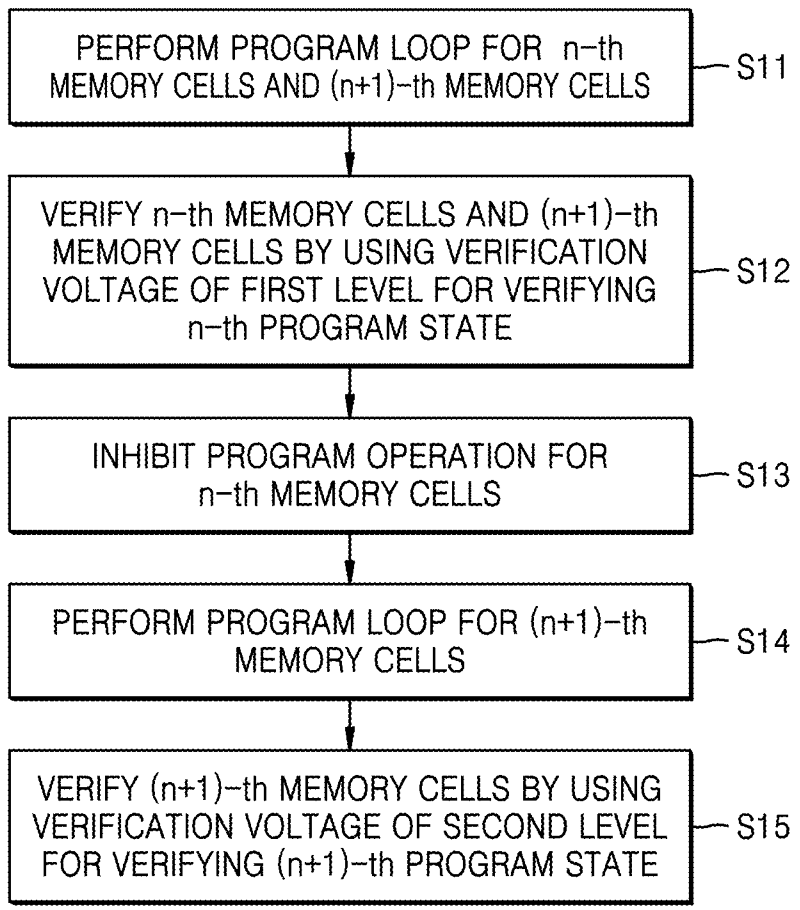
FIG. 4 is a flowchart illustrating an operating method of a memory device, according to at least one example embodiment of the inventive concepts.

FIG. 4 is a flowchart illustrating an operating method of a memory device, according to at least one example embodiment of the inventive concepts.

Referring to FIG. 4, a plurality of program loops may be performed on memory cells of a memory device in response to a write request from a host, and the memory cells may be programmed to multiple program states. For example, some (e.g., n-th memory cells) of the memory cells may be programmed to have a threshold voltage distribution corresponding to an n-th program state, and others (e.g., (n+1)-th memory cells) of the memory cells may be programmed to have a threshold voltage distribution corresponding to an n-th program state. For example, a threshold voltage level of the (n+1)-th program state may be greater than a threshold voltage level of the n-th program state.

As a write operation is performed, at least one program loop may be performed on the n-th memory cells and the (n+1)-th memory cells (S11). For example, the same voltage pulse may be provided to the n-th memory cells and the (n+1)-th memory cells, and accordingly, threshold voltages of the n-th memory cells and threshold voltages of the (n+1)-th memory cells may increase together. In addition, the n-th memory cells and the (n+1)-th memory cells may be verified by commonly using a first-level verification voltage for verifying an n-th program state (S12), and accordingly, the n-th memory cells and the n-th memory cells may be programmed with a distribution corresponding to the n-th program state.

Then, the n-th memory cells are programmed with a target distribution, and accordingly, the program operation for the n-th memory cells may be inhibited (S13). In addition, additional program loops may be performed on the (n+1)-th memory cells (S14), and in the additional program loops, the (n+1)-th memory cells may be verified by using a second-level verification voltage for verifying the (n+1)-th program state (S15). Accordingly, the (n+1)-th memory cells may be programmed with a distribution corresponding to the (n+1)-th program state corresponding to a target distribution.

Figure 5:
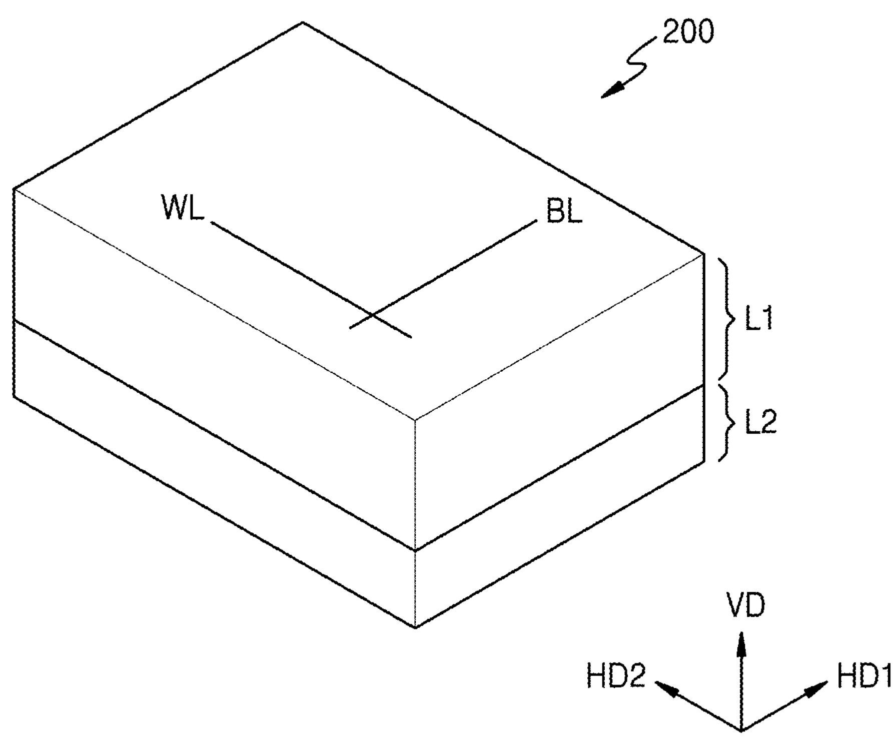
FIG. 5 is a schematic view illustrating a structure of the memory device of FIG. 1.

FIG. 5 is a view schematically illustrating a structure of the memory device of FIG. 1. Although FIG. 5 illustrates a cell over periphery (COP) structure as an implementation example of the memory device 200, the embodiments of the inventive concepts are not limited thereto, and the memory device 200 may be implemented by various structures.

Referring to FIGS. 1 to 5, the memory device 200 may include a first semiconductor layer L1 and a second semiconductor layer L2, and the first semiconductor layer L1 may be stacked on the second semiconductor layer L2 in a vertical direction VD. Specifically, the second semiconductor layer L2 may be below the first semiconductor layer L1 in the vertical direction VD, and accordingly, the second semiconductor layer L2 may be close to a substrate.

In at least one embodiment, the memory cell array 210 of FIG. 1 may be formed on the first semiconductor layer L1, and a peripheral circuit of FIG. 1 may be formed on the second semiconductor layer L2. Accordingly, the memory device 200 may have a structure in which the memory cell array 210 is over the peripheral circuit (e.g., the COP structure). The COP structure may effectively reduce an area in a horizontal direction and increase a degree of integration of the memory device 200.

In at least one embodiment, the second semiconductor layer L2 may include a substrate, and a peripheral circuit may be formed on the second semiconductor layer L2 by forming transistors and metal patterns for wiring the transistors on the substrate. After the peripheral circuit is formed on the second semiconductor layer L2, the first semiconductor layer L1 including the memory cell array 210 may be formed, and metal patterns may be formed to electrically connect the word lines WL and the bit lines BL of the memory cell array 210 to a peripheral circuit formed on the second semiconductor layer L2. For example, the bit lines BL may extend in a first horizontal direction HD1, and the word lines WL may extend in a second horizontal direction HD2.

Figure 6:
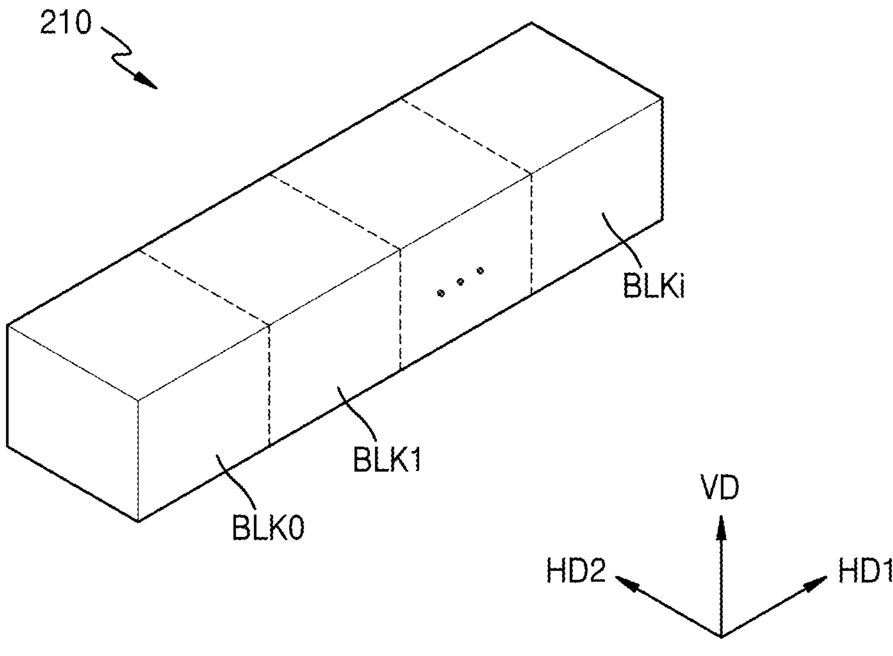
FIG. 6 is an example view illustrating a memory cell array of FIG. 1, according to at least one example embodiment of the inventive concepts.

FIG. 6 is an example view illustrating the memory cell array of FIG. 1 according to an embodiment of the inventive concepts.

Referring to FIGS. 1 to 6, the memory cell array 210 may include a plurality of memory blocks BLK0 to BLKi, wherein "i" may be a positive integer. Each of the plurality of memory blocks BLK0 to BLKi may have a 3D structure (or a vertical structure). For example, each of the plurality of memory blocks BLK0 to BLKi may include a plurality of NAND strings extending in the vertical direction VD. In these cases, the plurality of NAND strings may be separated from each other by a preset (or otherwise determined) distance in the first and second horizontal directions HD1 and HD2. The plurality of memory blocks BLK0 to BLKi may be selected by the row decoder 240. For example, the row decoder 240 may select a memory block corresponding to a block address from among the plurality of memory blocks BLK0 to BLKi.

Figure 7:
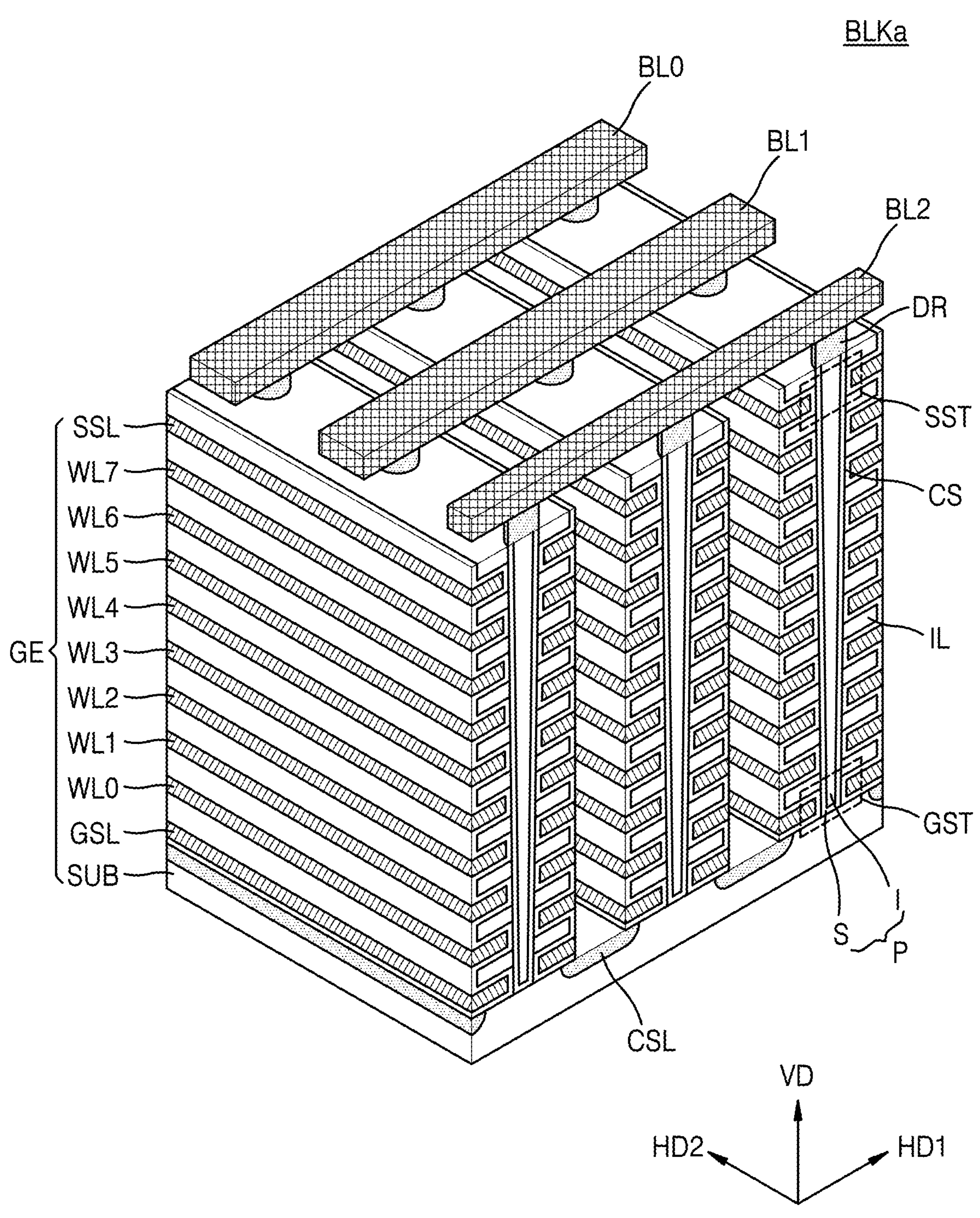
FIG. 7 is a perspective view illustrating a memory block of FIG. 6, according to at least one example embodiment of the inventive concepts.

FIG. 7 is a perspective view illustrating a memory block BLKa of FIG. 6 according to an embodiment of the inventive concepts.

Referring to FIGS. 1 to 7, the memory block BLKa is formed in a direction perpendicular to a substrate SUB. The substrate SUB may have a first conductivity type (for example, a p-type), and a common source line CSL, which extends in the second horizontal direction HD2 and is doped with impurities of a second conductivity type (for example, an n-type), is provided on the substrate SUB, A plurality of insulating films IL extending in the second horizontal direction HD2 are sequentially provided in the vertical direction VD in a region of the substrate SUB between two adjacent common source lines CSL, and the plurality of insulating layers IL are separated by a preset distance in the vertical direction VD. For example, the plurality of insulating layers IL may include an insulating material, such as silicon oxide.

A plurality of pillars P, which are sequentially arranged in the first horizontal direction HD1 and penetrate the plurality of insulating layers IL in the vertical direction VD, are provided in a region of the substrate SUB between two adjacent common source lines CSL. For example, the plurality of pillars P may penetrate the plurality of insulating layers IL to be in contact with the substrate SUB. Specifically, a surface layer S of each of the plurality of pillars P may include a first-type silicon material and may function as a channel region. Meanwhile, an inner layer I of each of the plurality of pillars P may include an insulating material, such as silicon oxide, or an air gap.

A charge storage layer CS may be provided along the insulating layers IL, the pillars P, and an exposed surface of the substrate SUB in a region between two adjacent common source lines CSL. The charge storage layer CS may include a gate insulating layer (or referred to as a "tunneling insulating layer"), a charge trap layer, and a blocking insulating layer. For example, the charge storage layer CS may have an oxide-nitride-oxide (ONO) structure. The charge storage layer CS may be configured as a carrier trap, and/or be configured to store a charge and/or data as a charge. In addition, a gate electrode GE including select lines GSL and SSL and word lines WL0 to WL7 (GE) may be provided on the exposed surface of the charge storage layer CS in a region between two adjacent common source lines CSL.

Drains or drain contacts DR may be respectively provided on the plurality of pillars P. For example, the drains or drain contacts DR may include a silicon material doped with impurities of a second conductivity type. Bit lines (e.g., BL0 to BL2), which extend in the first horizontal direction HD1 and are separated from each other by a preset distance in the second horizontal direction HD2, may be provided on the drains DR. The example embodiments are not limited to the number of elements illustrated. For example, the example embodiments may include more, or fewer, of the word lines, bit lines, and pillars than is illustrated.

Figure 8:
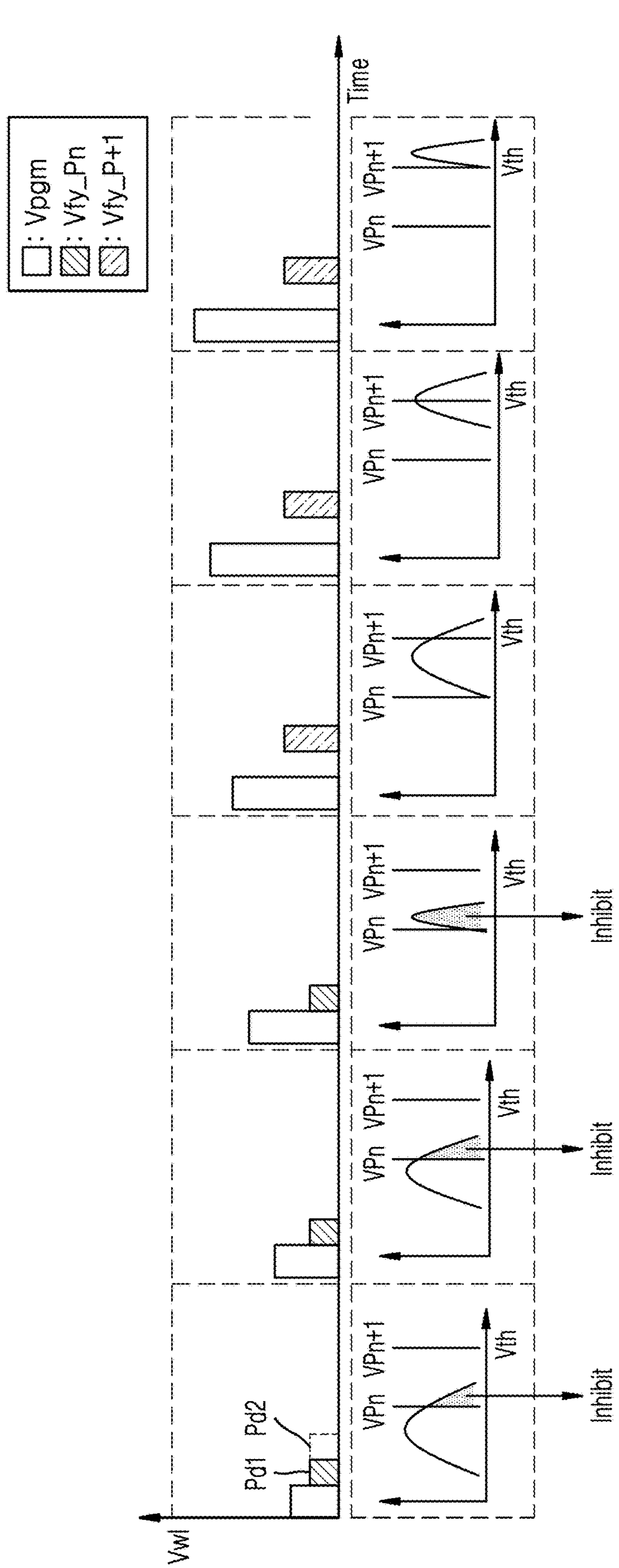
FIG. 8 is a diagram illustrating threshold voltage distribution characteristics of program loops, according to various embodiments of the inventive concepts.

FIG. 8 is a diagram illustrating threshold voltage distribution characteristics in program loops according to various embodiments of the inventive concepts. FIG. 8 illustrates an example of a change in threshold voltage distribution of the n-th memory cells and the (n+1)-th memory cells.

In at least one example embodiment, each program loop may include a period in which a program operation is performed and a period in which a verification operation is performed, and the period in which the verification operation is performed may include a plurality of periods in which verification is performed based on different verification levels. For example, one program loop may include a first period Pd1 in which the verification voltage Vfy_Pn for verifying the n-th state Pn is used and a second period Pd2 in which the verification voltage Vfy_Pn+1 for verifying the (n+1)-th state Pn+1 is used.

As the program loop progresses, the n-th memory cells and the (n+1)-th memory cells may be programmed by using the same program voltage Vpgm, and according to some embodiments of the inventive concepts, the (n+1)-th memory cells may be verified by using the verification voltage Vfy_Pn for verifying the n-th state Pn. In addition, as the program loop progresses, a level of the program voltage Vpgm may increase step by step, and a program operation on memory cells determined to pass in the verification operation of the n-th state Pn among the (n+1)-th memory cells may be inhibited.

The program operation on the n-th memory cells may be completed according to repetition of the program loops, and the program operation for the (n+1)-th memory cells may be performed in subsequent program loops. In these cases, a program operation for the program-inhibited (n+1)-th memory cells may be performed, and a verification operation may be performed by using the verification voltage Vfy_Pn+1 for verifying the (n+1)-th state Pn+1 to change a threshold voltage distribution of the (n+1)-th memory cells to a target distribution.

As illustrated in the graph of FIG. 8, when the threshold voltage distribution of the (n+1)-th memory cells is changed, programming of some of the (n+1)-th memory cells may be inhibited in at least one program loop while the (n+1)-th memory cells are programmed. Thereafter, as the verification voltage Vfy_Pn+1 for verifying the (n+1)-th state Pn+1 is used, the threshold voltage level of the (n+1)-th memory cells may increase again, and the (n+1)-th memory cells may change with the target distribution.

In the example illustrated in FIG. 8, for the sake of convenience of description, the first period Pd1 and the second period Pd2 are illustrated to be temporally divided in the verification period, and it is illustrated that verification is delayed by a preset time (time corresponding to the first period Pd1) in performing the verification operation on the (n+1)-th memory cells after a program operation on the n-th memory cells is completed, but embodiments of the inventive concepts are not limited thereto. For example, in one example, after the program operation on the n-th memory cells is completed, states prior to the (n+1)-th state Pn+1 may not be verified, and accordingly, a verification operation for the (n+1)-th memory cells may be performed without a separate delay during verification.

In addition, in the embodiment illustrated in FIG. 8, it is illustrated that verification operations are simultaneously performed when verifications for the n-th memory cells and the (n+1)-th memory cells are performed based on the same verification voltage Vfy_Pn, but the embodiments of the inventive concepts are not limited thereto. In at least one example embodiment, separate verification operations (or verification operations in different time periods) for the n-th memory cells and the (n+1)-th memory cells may be performed in the verification period, and in this case, the (n+1)-th memory cells may be verified based on the verification voltage Vfy_Pn.

In addition, in the example illustrated in FIG. 8, a case, in which the level of the program voltage Vpgm continuously increases while program loops are performed on the n-th memory cells and the (n+1)-th memory cells, is illustrated. In these cases, the number of program loops performed on the (n+1)-th memory cells may be reduced by not reducing the level of the program voltage Vpgm, and accordingly, the time required for the program operation may be reduced.

Figure 9:
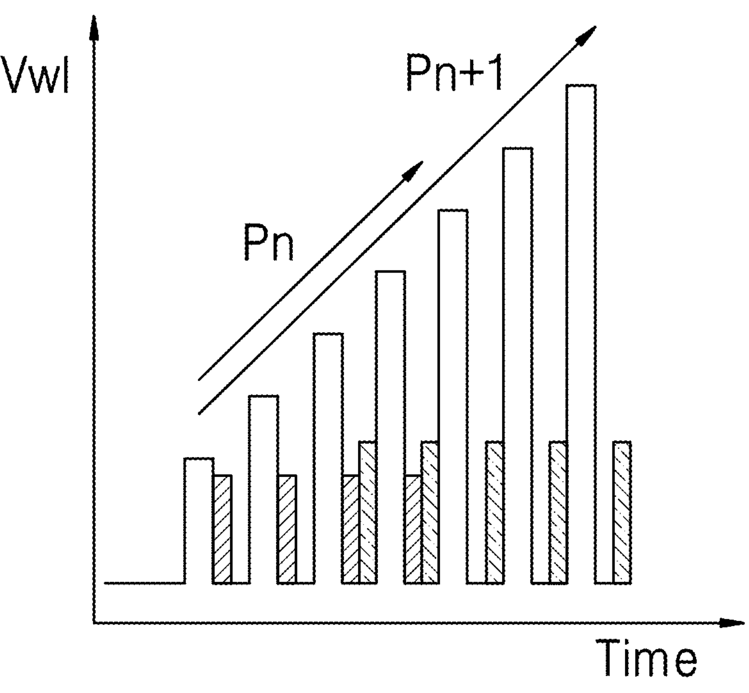
FIG. 9 is a waveform diagram illustrating a program operation according to at least one example embodiment of the inventive concepts.

FIG. 9 is a waveform diagram illustrating a program operation according to at least one example embodiment of the inventive concepts.

Referring to FIG. 9, as program loops progress, a voltage Vwl provided to word lines (e.g., levels of voltage pulses) increase, and the (n+1)-th memory cells to be programmed to the (n+1)-th state Pn+1 may be verified based on the verification voltage Vfy_Pn for verifying the n-th state Pn in some of a plurality of program loops performed on the n-th memory cells to be programmed to the n-th state Pn. Accordingly, some of the (n+1)-th memory cells are determined to be program pass based on the verification voltage Vfy_Pn for verifying the n-th state Pn, and thus, a program operation may be inhibited in at least one program loop.

According to at least one example embodiment of the inventive concepts at a certain timing during programming of the n-th memory cells, the (n+1)-th memory cells may be verified based on the verification voltage Vfy_Pn+1 for verifying the (n+1)-th state Pn+1 to program the (n+1)-th memory cells to the (n+1)-th state Pn+1 corresponding to a target distribution. The certain timing may be set in various ways. In at least one example, the verification level of the (n+1)-th memory cells may be changed after a preset (or otherwise determined) number of program loops are performed on the n-th memory cells. Alternatively, when a ratio of memory cells determined to be program pass among the n-th memory cells is greater than or equal to a preset (or otherwise determined) value, verification levels of the (n+1)-th memory cells may also be changed. Embodiments of the inventive concepts are not limited to the above cases, and an internal setting operation may be performed to change the verification levels of the (n+1)-th memory cells at various timings.

Referring to FIG. 9, in some program loops, the n-th memory cells and the (n+1)-th memory cells may be verified together by using the verification voltage Vfy_Pn for verifying the n-th state Pn. In addition, as the verification levels of the (n+1)-th memory cells are changed at the certain timing, an operation of verifying the n-th memory cells by using the verification voltage Vfy_Pn for verifying the n-th state Pn and an operation of verifying the (n+1)-th memory cells by using the verification voltage Vfy_Pn+1 for verifying the n+1 th state Pn+1 may be performed together in some other program loops. In addition, after the program operation for the n-th memory cells is completed, the (n+1)-th memory cells may be verified by using the verification voltage Vfy_Pn+1 for verifying the (n+1)-th state Pn+1 without verification using the verification voltage Vfy_Pn for verifying the n-th state Pn.

Some of the (n+1)-th memory cells may correspond to fast cells of which threshold voltage level increases rapidly, and threshold voltage levels of the fast cells are relatively higher than threshold voltage levels of other memory cells, and accordingly, threshold voltage distribution characteristics of the (n+1)-th memory cells may deteriorate. However, according to the example described above, the fast cells are determined to program pass in some of the program loops for the n-th memory cells, and accordingly, programming of only the fast cells is inhibited, and a program operation for the (n+1)-th memory cells may be performed. Accordingly, a programming speed of the (n+1)-th memory cells may be increased and threshold voltage distribution characteristics of the (n+1)-th memory cells may be improved.

Figure 10:
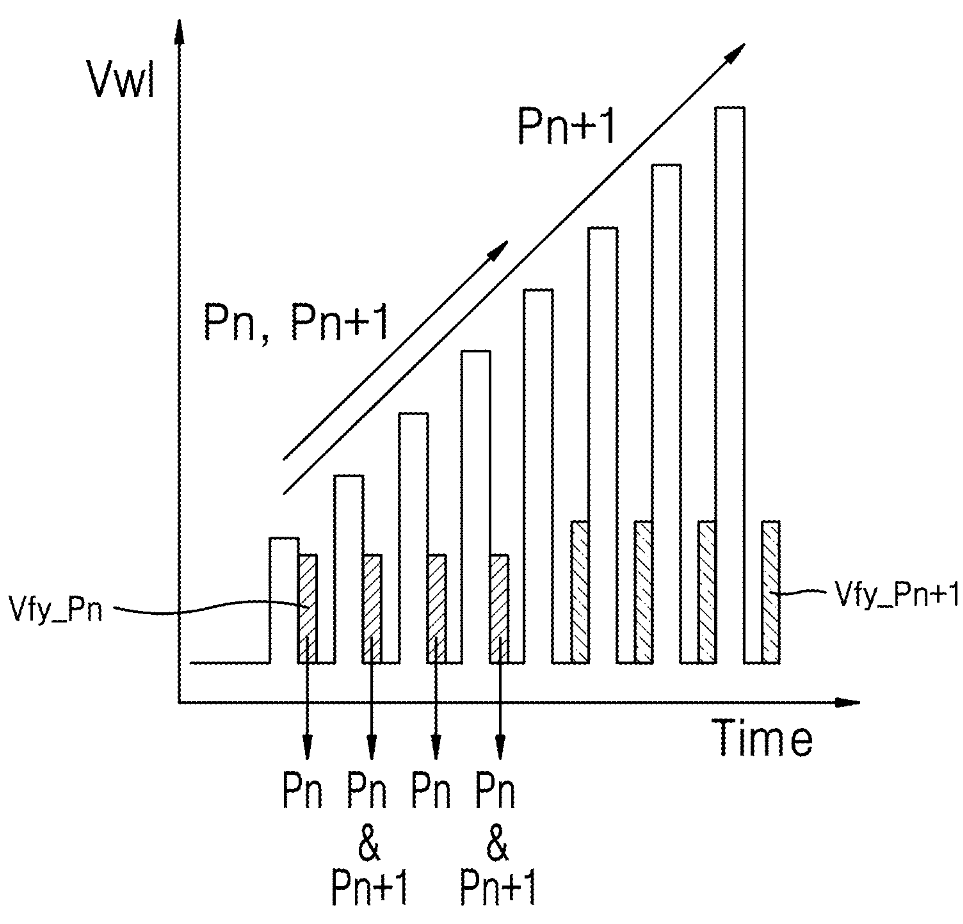
FIG. 10 is a diagram illustrating a program example of a memory device, according to at least one example embodiment of the inventive concepts.

FIG. 10 is a diagram illustrating a program example of a memory device according to at least one example embodiment of the inventive concepts. Although FIG. 10 illustrates a case in which a level of a voltage pulse continuously increases in programming memory cells programmed to multiple program states, embodiments of the inventive concepts are not limited thereto.

Referring to FIG. 10, in at least some of program loops performed on the n-th memory cells, the (n+1)-th memory cells may be verified by using the verification voltage Vfy_Pn for verifying the n-th state Pn. According to the example described above, the (n+1)-th memory cells may be verified based on the verification voltage Vfy_Pn in all program loops performed on the n-th memory cells, or the (n+1)-th memory cells may be verified based on the verification voltage Vfy_Pn in some program loops.

In at least one example embodiment, a verification operation for the (n+1)-th memory cells using the verification voltage Vfy_Pn for verifying the n-th state Pn may not be continuously performed. For example, in the example embodiment illustrated in FIG. 10, the verification operation for the (n+1)-th memory cells using the verification voltage Vfy_Pn may be discontinuously performed, and a verification operation for only the n-th memory cells may be selectively performed in some program loops.

Assuming that the verification operation is selectively performed only on the n-th memory cells in the first and third program loops among the first to fourth program loops and the n-th memory cells and the (n+1)-th memory cells are verified in the second and fourth program loops, a verification operation is not performed on a program pass of the (n+1)-th memory cells in the first program loop. Accordingly, the (n+1)-th memory cells programmed in the first program loop may also be programmed in the second program loop, and the (n+1)-th memory cells may be verified by using the verification voltage Vfy_Pn for verifying the n-th state Pn in the second program loop. In addition, a program operation for the (n+1)-th memory cells determined to be program pass in the first program loop may be inhibited in the next second program loop. Therefore, multiple program loops, including a first program loop to an A-th program loop (wherein A is an integer greater than or equal to 2) may be performed. In these cases, whether the programming of the one or more (n+1)-th memory cells passes or fails (e.g., during the first program loop to a B-th program loop) may be determined based on the verification voltage having a first level (e.g., for verifying the n-th program state and wherein B is an integer greater than or equal to 1 and less than A), and/or, after the B-th program loop, whether the programming of the (n+1)-th memory cells passes or fails may be determined based on the verification voltage having a second level (e.g., for verifying the (n+1)-th program state). In at least one embodiment, if a program loop (e.g., one of the first program loop to the B-th program loop) fails, the program loop may be repeated until the (n+1)-th memory cells passes, and/or the program loop may be addressed to a different memory cell.

In addition, after the program operation for the n-th memory cells is completed through the above process, a verification operation for the (n+1)-th memory cells may be performed by using the verification voltage Vfy_Pn+1 for verifying the (n+1)-th state Pn+1.

Figure 11:
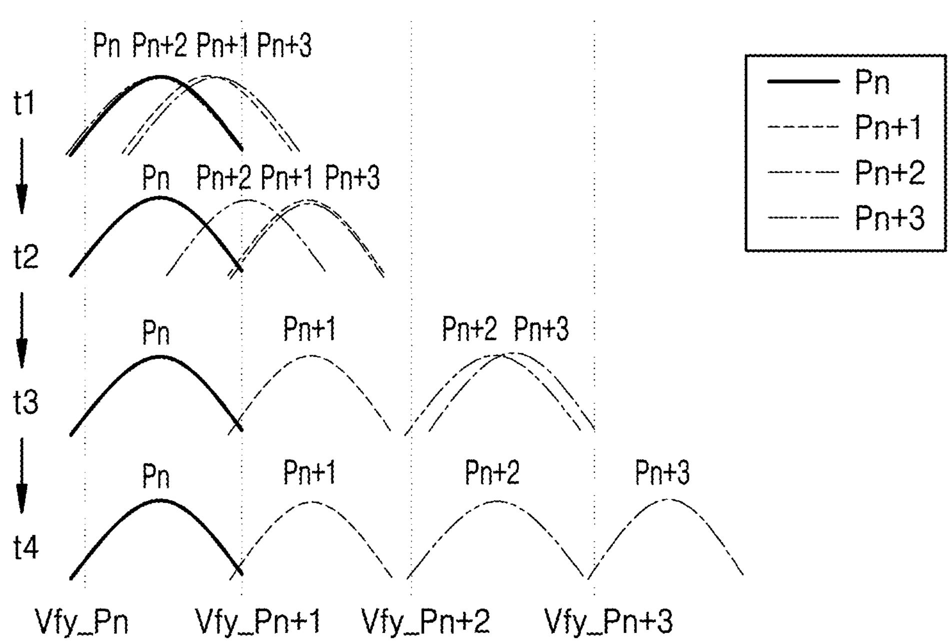
FIGS. 11 to 13 are diagrams illustrating program operations according to various example embodiments of the inventive concepts.
Figure 12:
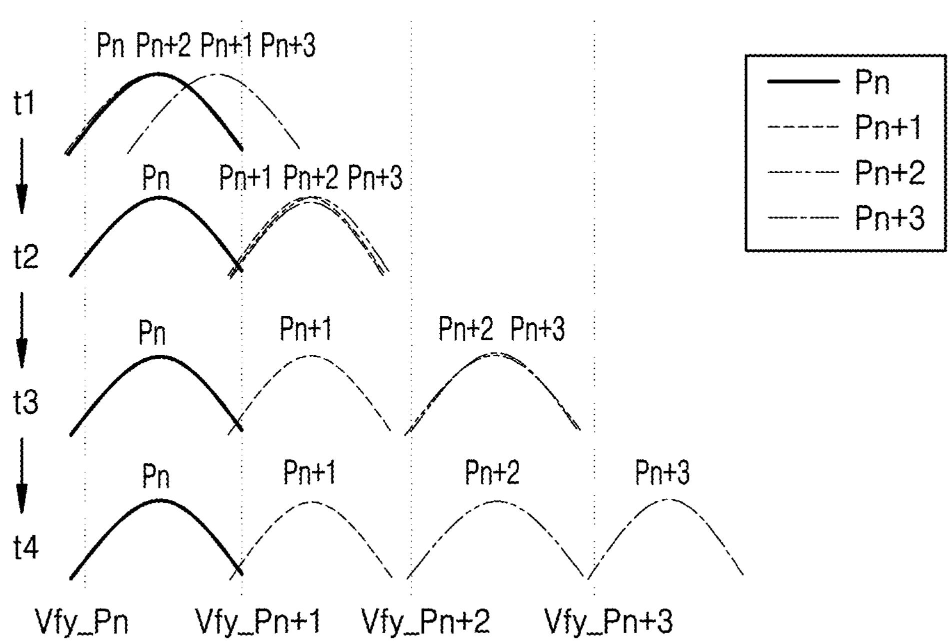
Figure 13:
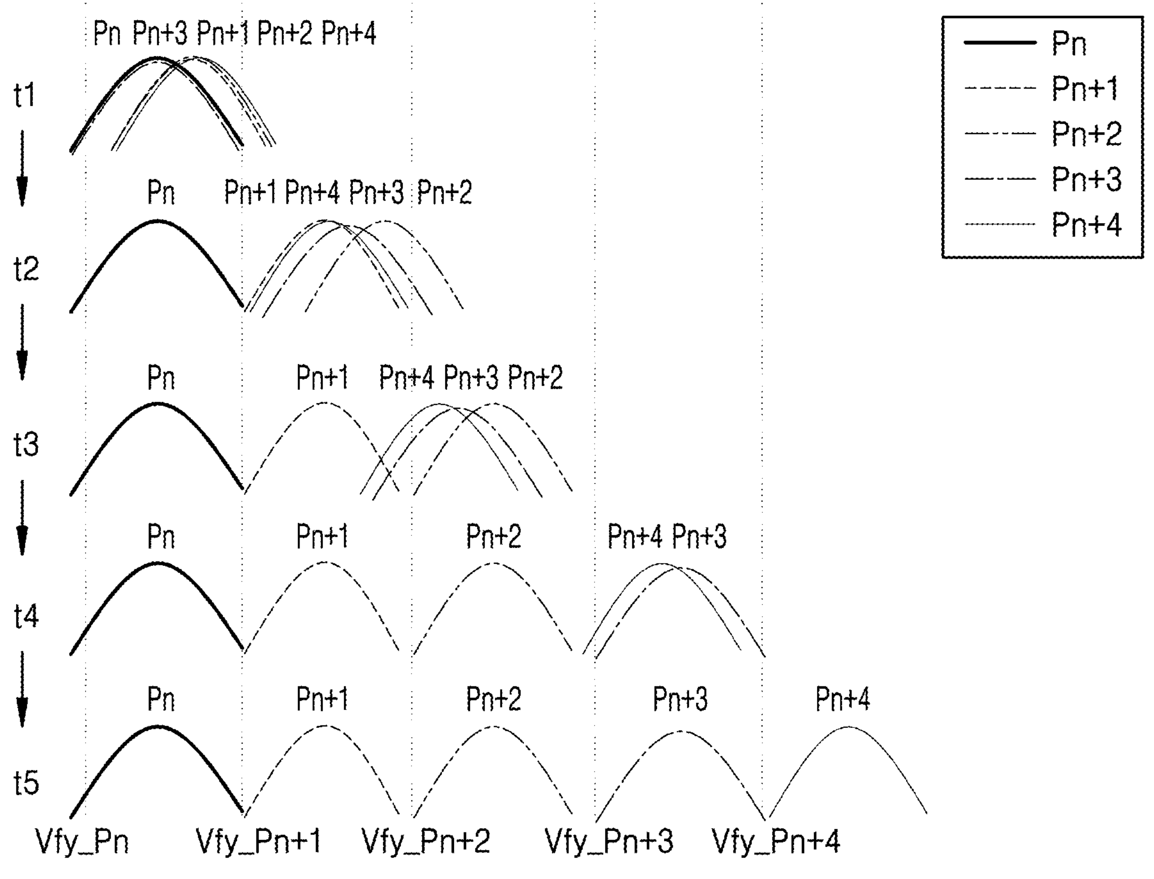

Hereinafter, program operations according to various example embodiments of the inventive concepts are described. FIGS. 11 to 13 are diagrams illustrating program operations according to various example embodiments of the inventive concepts.

According to at least one example embodiment of the inventive concepts, program loops may be controlled such that at least three threshold voltage distributions have the same or similar level during a program process. FIG. 11 illustrates a case in which three adjacent threshold voltage distributions have the same or similar level during a program process.

As the program loop progresses, the (n+1)-th memory cells and the (n+2)-th memory cells are verified based on the verification voltage Vfy_Pn for verifying the n-th state Pn, and accordingly, threshold voltage distributions of the n-th memory cells, the (n+1)-th memory cells, and the (n+2)-th memory cells may be located identically or similarly to the distribution corresponding to the n-th state Pn. In addition, in at least one example embodiment, (n+3)-th memory cells are verified by using a program state verification voltage having a threshold voltage level higher than the threshold voltage level of the n-th state Pn, and accordingly, the threshold voltage level of the (n+3)-th memory cells may increase. In at least one example embodiment, the (n+3)-th memory cells may be verified based on various program states. For example, at the first point in time t1, the (n+3)-th memory cells may be verified based on the verification voltage Vfy_Pn+1 for verifying the (n+1)-th state Pn+1.

Then, the (n+1)-th memory cells may be verified by using the verification voltage Vfy_Pn+1 in the (n+1)-th state Pn+1, and the (n+2)-th memory cells and the (n+3)-th memory cells may also be verified by using the verification voltage Vfy_Pn+1 in the (n+1)-th state Pn+1. Accordingly, the threshold voltage distributions of the (n+1)-th memory cells, the (n+2)-th memory cells, and the (n+3)-th memory cells may be located identically or similarly to the distribution corresponding to the (n+1)-th state Pn+1 at a second point in time t2.

Thereafter, the (n+2)-th memory cells may be verified by using the verification voltage Vfy_Pn+2 in the (n+2)-th state Pn+2, and the (n+3)-th memory cells may also be verified by using the verification voltage Vfy_Pn+2 in the (n+2)-th state Pn+2. Accordingly, the threshold voltage distributions of the (n+2)-th memory cells and the (n+3)-th memory cells may be located identically or similarly to the distribution corresponding to the (n+2)-th state Pn+2 at a third point in time t3. Thereafter, the (n+3)-th memory cells may be verified by using the verification voltage Vfy_Pn+3 in the (n+3)-th state Pn+3, and the threshold voltage distribution of the (n+3)-th memory cells may be changed to a target distribution corresponding to the (n+3)-th state Pn+3 at a fourth point in time t4.

FIGS. 12 and 13 illustrate a case in which threshold voltage distributions of program states that are not adjacent to each other are located identically or similarly to each other.

Referring to FIG. 12, as the program loop progresses, the n-th memory cells and the (n+2)-th memory cells are verified by using the verification voltage Vfy_Pn in the n-th state Pn, and accordingly, threshold voltage distributions of the n-th memory cells and the (n+2)-th memory cells may be located identically or similarly to the distribution corresponding to the n-th state Pn at a first point in time t1. In addition, as the program loop progresses, the (n+1)-th memory cells and the (n+3)-th memory cells are verified by using the verification voltage Vfy_Pn+1 in the (n+1)-th state Pn+1, and accordingly, threshold voltage levels of the (n+1)-th memory cells and the (n+3)-th memory cells may gradually increase.

Thereafter, the (n+2)-th memory cells are verified by using the verification voltage Vfy_Pn+2 in the (n+2)-th state Pn+2, and accordingly, threshold voltage levels of the (n+2)-th memory cells may gradually increase. In addition, the (n+1)-th memory cells and the (n+3)-th memory cells are verified by using the verification voltage Vfy_Pn+1 in the (n+1)-th state Pn+1, and accordingly, threshold voltage distributions of the (n+1)-th memory cells and the (n+3)-th memory cells may be located identically or similarly to the distribution corresponding to the (n+1)-th state Pn+1 at a second point in time t2.

In addition, as the threshold voltage levels of the (n+2)-th memory cells gradually increase, the threshold voltage distributions of the (n+2)-th memory cells may be changed to a distribution corresponding to the (n+2)-th state Pn+2 at the second point in time t2. In addition, as the (n+3)-th memory cells are verified by using the verification voltage Vfy_Pn+3 in the (n+3)-th state Pn+3, the threshold voltage distributions of the (n+3)-th memory cells may be changed to a distribution corresponding to the (n+3)-th state Pn+3 at the second point in time t2.

FIG. 13 illustrates a case in which threshold voltage distributions of two or more separated program states are located identically or similarly to each other.

Referring to FIG. 13, as the program loop progresses, the n-th memory cells and the (n+3)-th memory cells are verified by using the verification voltage Vfy_Pn in the n-th state Pn, and accordingly, threshold voltage distributions of the n-th memory cells and the (n+3)-th memory cells may be located identically or similarly to the distribution corresponding to the n-th state Pn at the first point in time t1. In addition, the (n+1)-th memory cells, the (n+2)-th memory cells, and (n+4)-th memory cells are verified by using a verification voltage in another program state, and accordingly, threshold voltage levels of the (n+1)-th memory cells, the (n+2)-th memory cells, and (n+4)-th memory cells may gradually increase as the program loop progresses. In at least one example embodiment, the (n+2)-th memory cells may be verified by using the verification voltage Vfy_Pn+2 in the (n+2)-th state Pn+2 to be programmed to a target program state. In addition, the (n+1)-th memory cells and the (n+4)-th memory cells may be verified by using the verification voltage Vfy_Pn+1 in the (n+1)-th state Pn+1, and threshold voltage level of the (n+1)-th memory cells and the (n+4)-th memory cells may gradually increase.

Thereafter, as the (n+3)-th memory cells are verified by using the verification voltage Vfy_Pn+3 in the (n+3)-th state Pn+3, threshold voltage levels of the (n+3)-th memory cells may gradually increase. In addition, as the (n+1)-th memory cells and the (n+4)-th memory cells are verified by using the verification voltage Vfy_Pn+1 in the (n+1)-th state Pn+1, threshold voltage distributions of the (n+1)-th memory cells and the (n+4)-th memory cells may be located identically or similarly to the distribution corresponding to the (n+1)-th state Pn+1 at the second point in time t2.

Thereafter, the (n+4)-th memory cells are verified by using the verification voltage Vfy_Pn+4 in the (n+4)-th state Pn+4, and accordingly, the threshold voltage levels of the (n+4)-th memory cells may gradually increase. As program loops are performed based on the verification operation described above, a threshold voltage distribution of the (n+2)-th memory cells may be changed to the distribution corresponding to the (n+2)-th state Pn+2 at the third point in time t3, and a threshold voltage distribution of the (n+3)-th memory cells may be changed to the distribution corresponding to the (n+3)-th state Pn+3 at the third point in time t4. In addition, a threshold voltage distribution of the (n+4)-th memory cells may be changed to the distribution corresponding to the (n+4)-th state Pn+4 at a fifth point in time t5.

Figure 14:
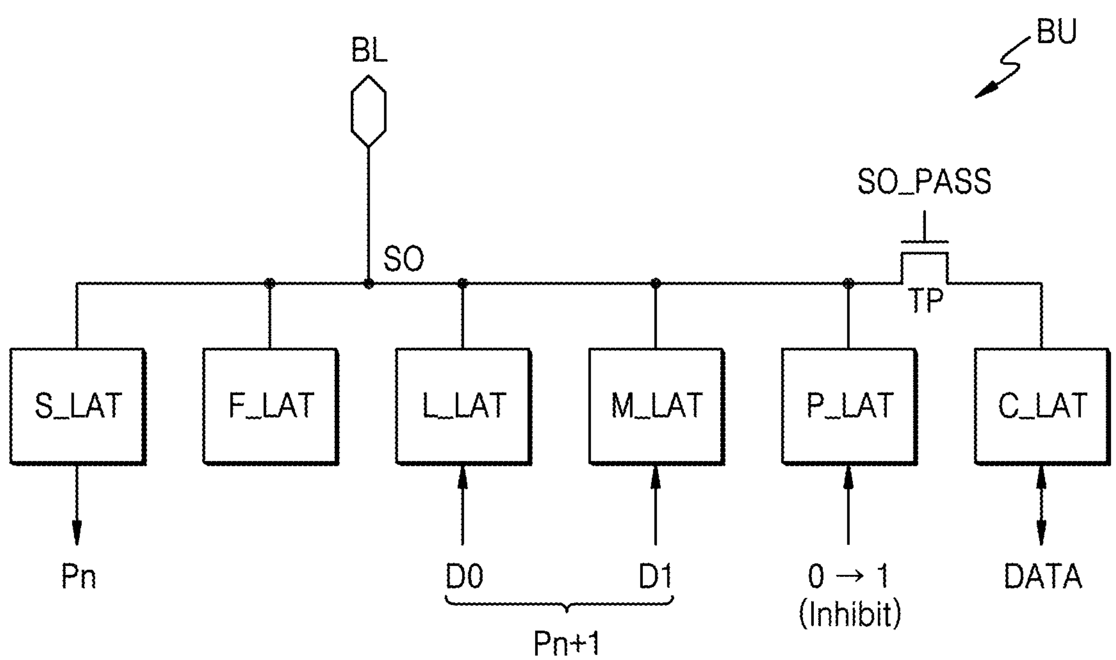
FIG. 14 is a block diagram illustrating an implementation example of a page buffer of a memory device according to at least one example embodiment of the inventive concepts.

FIG. 14 is a block diagram illustrating an implementation example of a page buffer of a memory device according to at least one example embodiment of the inventive concepts.

FIG. 14 illustrates an implementation example of a buffer unit connected to one bit line.

The page buffer may include a plurality of buffer units BU arranged to respectively correspond to a plurality of bit lines. Referring to a (e.g., one) buffer unit BU illustrated in FIG. 14, the buffer unit BU may include a plurality of latches. For example, the buffer unit BU may include a cache latch C_LAT, a sensing latch SLAT, a force latch F_LAT, a first latch (or a lower bit latch) L_LAT, a second latch (or an upper bit latch) M_LAT, and an additional latch P_LAT. In an operation example, the additional latch P_LAT may store information indicating program pass or program fail of a memory cell to be programmed through a corresponding bit line BL and may be referred to as a pass latch. When programming of the memory cell is determined to pass, information of a preset logic state may be stored in the additional latch P_LAT, and for example, information having a logic high value may be stored in the additional latch P_LAT.

The cache latch C_LAT may receive and store data DATA to be programmed in a memory cell. In addition, the cache latch C_LAT may be electrically connected to the other latches in the buffer unit BU through a pass transistor T_P, and the pass transistor T_P may be turned on or off in response to a pass signal SO_PASS. When the pass transistor T_P is turned on, the data DATA may be transferred between the cache latch C_LAT and the other latches.

The buffer unit BU may be connected to the bit line BL through a sensing node SO and may program data through the bit line BL or sense data through the bit line BL. According to the examples described above, data of a memory cell connected to the bit line BL may be read to perform a verification operation in program loops, and a sensing result for data reading may be stored in the sensing latch SLAT.

In at least one example, the force latch F_LAT may be used to improve a threshold voltage distribution during a program operation and may be used to adjust a precharge (or otherwise determined) level of a corresponding bit line BL. For example, a level of a voltage precharged in a corresponding bit line BL may be changed according to a value stored in the force latch F_LAT, and the amount of change in threshold voltage of a memory cell connected to the bit line BL may be adjusted by a program operation. In addition, data of multiple bits may be stored in one memory cell, and during a program operation, bits of data to be currently programmed may be stored in at least some of the first latch L_LAT, the second latch M_LAT, and the cache latch C_LAT.

According to at least one example embodiment of the inventive concepts, when data programming is performed based on the bits stored in the first latch L_LAT and the second latch M_LAT, a threshold voltage distribution of a corresponding memory cell may be determined according to values of bits D0 and D1. In one example, when the values of the bits DO and D1 correspond to the (n+1)-th state Pn+1, program loops may be controlled based on the values of DO and D1 such that the threshold voltage of the memory cell is higher than a level of the verification voltage corresponding to the (n+1)-th state Pn+1. For example, a memory cell connected to the bit line BL may be the (n+1)-th memory cell.

According to at least one example embodiment of the inventive concepts, data stored in a memory cell may be read during a verification process, and as illustrated in FIG. 14, a sensing result stored in the sensing latch S_LAT may correspond to the n-th state Pn. In these cases, the sensing result stored in the sensing latch S_LAT may be verified based on a verification level for verifying the n-th state Pn, and as the sensing result is determined to program pass, information stored in the additional latch P_LAT may be changed from a logic low value to a logic high value.

Figure 15:
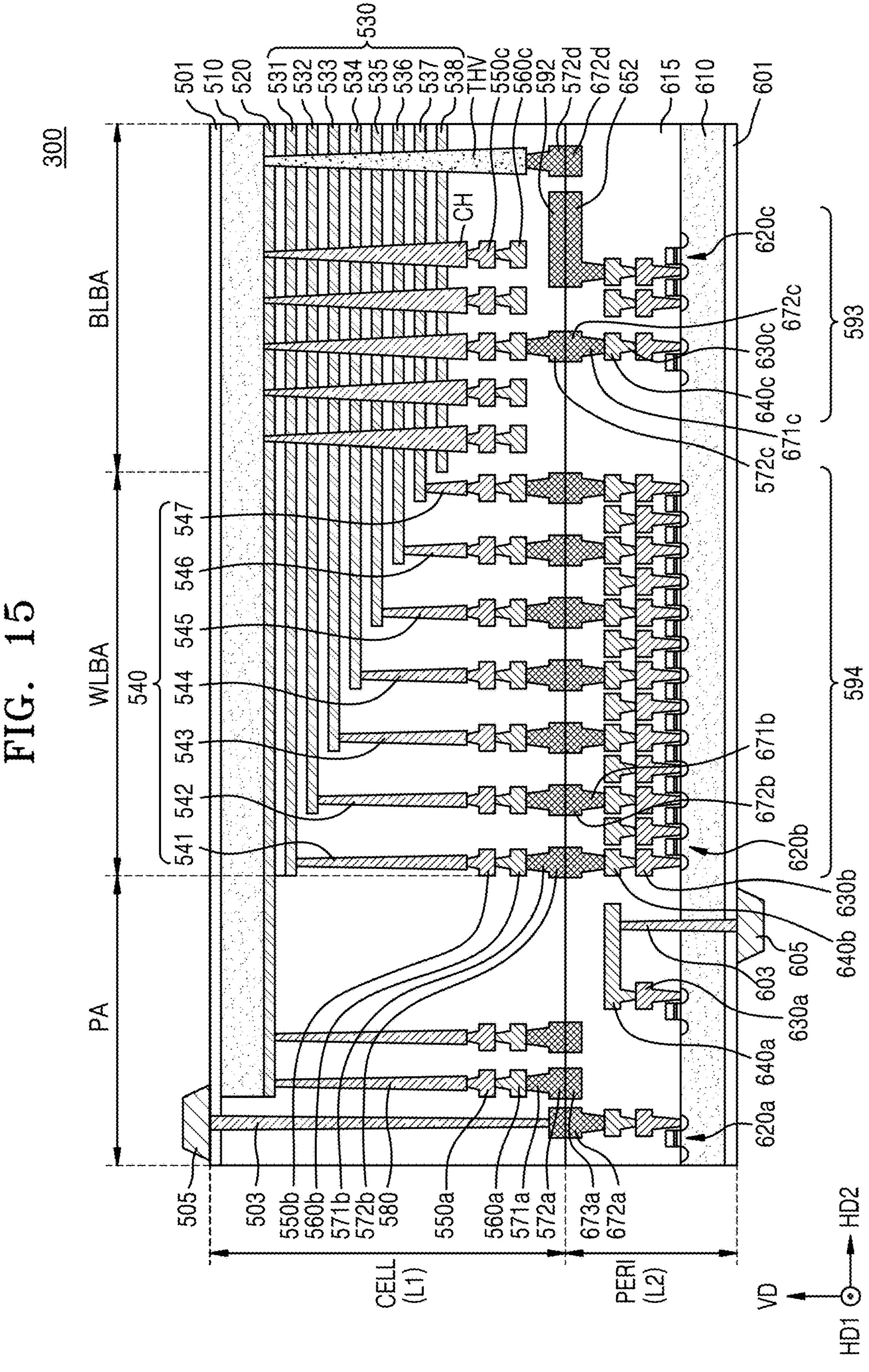
FIG. 15 is a cross-sectional view of a memory device having a B-VNAND structure, according to an embodiment of the inventive concepts.

FIG. 15 is a cross-sectional view of a memory device having a bonding vertical NAND (B-VNAND) structure, according to at least one embodiment of the inventive concepts. When a nonvolatile memory included in the memory device is implemented as a B—VNAND type flash memory, the nonvolatile memory may have the structure illustrated in FIG. 15.

Referring to FIG. 15, a cell region CELL of a memory device 300 may correspond to a first semiconductor layer L1, and a peripheral circuit region PERI may correspond to a second semiconductor layer L2. The peripheral circuit region PERI and the cell region CELL of the memory device 300 may each include an external pad bonding region PA, a word line bonding region WLBA, and a bit line bonding region BLBA. For example, the plurality of word lines WL, the plurality of string selection lines SSL, the plurality of ground selection lines GSL, and the memory cell array 210 illustrated in FIG. 2 may be formed in the first semiconductor layer L1, and the voltage generator 220, the control logic 230, the row decoder 240, and the page buffer 250 may be formed in the second semiconductor layer L2.

The peripheral circuit region PERI may include a first substrate 610, an interlayer insulating layer 615, a plurality of circuit elements 620*a*, 620*b*, and 620*c* formed on the first substrate 610, first metal layers 630*a*, 630*b*, and 630*c* respectively connected to a plurality of circuit elements 620*a*, 620*b*, and 620*c*, and second metal layers 640*a*, 640*b*, and 640*c* formed on the first metal layers 630*a*, 630*b*, and 630*c*. In at least one example embodiment, the first metal layers 630*a*, 630*b*, and 630*c* may be formed of a first metal (e.g., tungsten) having relatively high resistance, and the second metal layers 640*a*, 640*b*, and 640*c* may be formed of a second metal (e.g., copper) having relatively low resistance.

Although the present specification describes only the first metal layers 630*a*, 630*b*, and 630*c* and the second metal layers 640*a*, 640*b*, and 640*c*, the inventive concepts is not limited thereto, and at least one metal layer may be further formed on the second metal layers 640*a*, 640*b*, and 640*c*. At least some of the one or more metal layers formed on the second metal layers 640*a*, 640*b*, and 640*c* may be formed of a third metal (e.g., aluminum) having a lower resistance than copper forming the second metal layers 640*a*, 640*b*, and 640*c*.

The interlayer insulating layer 615 may be on the first substrate 610 to cover and/or protect the plurality of circuit elements 620*a*, 620*b*, and 620*c*, the first metal layers 630*a*, 630*b*, and 630*c*, and the second metal layers 640*a*, 640*b*, and 640*c* and may include an insulating material, such as silicon oxide or silicon nitride.

Lower bonding metals 671*b* and 672*b* may be formed on the second metal layer 640*b* in the word line bonding region WLBA. In the word line bonding region WLBA, the lower bonding metals 671*b* and 672*b* in the peripheral circuit region PERI may be electrically connected to the upper bonding metals 571*b* and 572*b* in the cell region CELL by a bonding method, and the lower bonding metals 671*b* and 672*b* and the upper bonding metals 571*b* and 572*b* may be formed of, and/or include, the first, second, and/or third metal (e.g., aluminum, copper, and/or tungsten).

The cell region CELL may provide at least one memory block. The cell region CELL may include a second substrate 510 and a common source line 520. A plurality of word lines 531 to 538 (530) may be stacked on the second substrate 510 in a direction VD perpendicular to an upper surface of the second substrate 510. String select lines and a ground select line may be on upper and lower portions of the plurality of word lines 530, and the plurality of word lines 530 may be between the string select lines and the ground select line.

In the bit line bonding region BLBA, a channel structure CH may extend in a direction perpendicular to the upper surface of the second substrate 510 to pass through the plurality of word lines 530, the string select lines, and the ground select line. The channel structure CH may include a data storage layer, a channel layer, and a buried insulating layer, and the channel layer may be electrically connected to a first metal layer 550*c* and a second metal layer 560*c*. For example, the first metal layer 550*c* may be a bit line contact, and the second metal layer 560*c* may be a bit line 560*c*. In at least one example embodiment, the bit line 560*c* may extend in a second horizontal direction HD2 parallel to the upper surface of the second substrate 510.

In at least one example embodiment, a region where the channel structure CH and the bit line 560*c* are arranged may be defined as the bit line bonding region BLBA. The bit line 560*c* may be electrically connected to the circuit elements 620*c* included in a page buffer 593 in the peripheral circuit region PERI in the bit line bonding region BLBA. For example, the bit line 560*c* may be connected to the upper bonding metals 571*c* and 572*c* in the cell region CELL, and the upper bonding metals 571*c* and 572*c* may be connected to the lower bonding metals 671*c* and 672*c* connected to the circuit elements 620*c* of the page buffer 593. Accordingly, the page buffer 593 may be connected to the bit line 560*c* through the upper bonding metals 571*c* and 572*c* and the lower bonding metals 671*c* and 672*c*.

In at least one embodiment, the memory device 300 may further include a through-electrode THV in the bit line bonding region BLBA. The through-electrode THV may pass through the word lines 530 and extend in the vertical direction VD. The through-electrode THV may be connected to the common source line 520 and/or the upper substrate 510. Although not illustrated, an insulating ring may be around the through-electrode THV, and the through-electrode THV may be insulated from the plurality of word lines 530. The through-electrode THV may be connected to the peripheral circuit region PERI through the upper bonding metal 572*d* and the lower bonding metal 672*d*.

In the word line bonding region WLBA, the plurality of word lines 530 may extend in the first horizontal direction HD1 parallel to the upper surface of the second substrate 510 and may be connected to a plurality of cell contact plugs 541 to 547 (540). The plurality of word lines 530 may be respectively connected to the cell contact plugs 540 by pads formed by extending at least some of the word lines 530 in different lengths in the vertical direction VD. The first metal layer 550*b* and the second metal layer 560*b* may be sequentially connected to upper portions of the plurality of cell contact plugs 540 connected to the plurality of word lines 530. The plurality of cell contact plugs 540 may be connected to the peripheral circuit region PERI through the upper bonding metals 571*b* and 572*b* of the cell region CELL and the lower bonding metals 671*b* and 672*b* of the peripheral circuit region PERI, in the word line bonding region WLBA.

The plurality of cell contact plugs 540 may be electrically connected to circuit elements 620*b* included in a row decoder 594, in the peripheral circuit region PERI. In at least one example embodiment, operating voltages of the circuit elements 620*b* included in the row decoder 594 may be different from operating voltages of the circuit elements 620*c* included in the page buffer 593. For example, the operating voltages of the circuit elements 620*c* included in the page buffer 593 may be higher than the operating voltages of the circuit elements 620*b* included in the row decoder 594.

A common source line contact plug 580 may be in the external pad bonding region PA. The common source line contact plug 580 may be formed of a conductive material, such as metal, metal compound, or polysilicon and may be electrically connected to the common source line 520. A first metal layer 550*a* and a second metal layers 560*a* may be sequentially stacked on the common source line contact plug 580. For example, a region, in which the common source line contact plug 580, the first metal layer 550*a*, and the second metal layer 560*a* are arranged, may be defined as the external pad bonding region PA.

In addition, input/output pads 505 and 605 may be in the external pad bonding region PA. A lower insulating film 601 covering a lower surface of the first substrate 610 may be formed under the first substrate 610, and the first input/output pad 605 may be formed on the lower insulating film 601. The first input/output pad 605 may be connected to at least one of the plurality of circuit elements 620*a*, 620*b*, and 620*c* in the peripheral circuit region PERI through a first input/output contact plug 603 and may be separated from the first substrate 610 by the lower insulating film 601. In addition, a side insulating layer may be between the first input/output contact plug 603 and the first substrate 610 to electrically separate the first input/output contact plug 603 from the first substrate 610.

An upper insulating layer 501 covering the upper surface of the second substrate 510 may be formed on the second substrate 510, and the second input/output pad 505 may be on the upper insulating layer 501. The second input/output pad 505 may be connected to at least one of the plurality of circuit elements 620*a*, 620*b*, and 620*c* in the peripheral circuit region PERI through the second input/output contact plug 503.

According to some example embodiments, the second substrate 510 and the common source line 520 may not be in a region where the second input/output contact plug 503 is arranged. In addition, according to some example embodiments, the second input/output pad 505 may not overlap the plurality of word lines 530 in a third direction (a Z-axis direction). The second input/output contact plug 503 may be separated from the second substrate 510 in a direction parallel to the upper surface of the second substrate 510 and may penetrate an interlayer insulating layer in the cell region CELL to be connected to the second input/output pad 505.

According to some example embodiments, the first input/output pad 605 and the second input/output pad 505 may be selectively formed. For example, the memory device 300 may include only the first input/output pad 605 over the first substrate 610 or may include only the second input/output pad 505 over the second substrate 510. Alternatively, the memory device 300 may also include both the first input/output pad 605 and the second input/output pad 505.

A metal pattern of the uppermost metal layer may be provided as a dummy pattern in each of the external pad bonding region PA and the bit line bonding region BLBA respectively included in the cell region CELL and the peripheral circuit region PERI, or there may be no uppermost metal layer.

In the outer pad bonding region PA of the memory device 300, a lower metal pattern 672*a* and 673*a* having the same shape as an upper metal pattern 571*a* and 572*a* may be formed on the uppermost metal layer of the peripheral circuit region PERI to correspond to the upper metal pattern 572*a* formed on the uppermost metal layer of the cell region CELL. The lower metal pattern 673*a* formed on the uppermost metal layer of the peripheral circuit region PERI may not be connected to a separate contact in the peripheral circuit region PERI. Similarly, in the outer pad bonding region PA, an upper metal pattern having the same shape as the lower metal pattern in the peripheral circuit region PERI may also be formed on the upper metal layer of the cell region CELL to correspond to the lower metal pattern formed on the uppermost metal layer of the peripheral circuit region PERI.

The lower bonding metals 671*b* and 672*b* may be formed on the second metal layer 640*b* in the word line bonding region WLBA. In the word line bonding region WLBA, the lower bonding metals 671*b* and 672*b* in the peripheral circuit region PERI may be respectively electrically connected to the upper bonding metals 571*b* and 572*b* in the cell region CELL by a bonding method.

In addition, in the bit line bonding region BLBA, an upper metal pattern 592 having the same shape as a lower metal pattern 652 may be formed on the uppermost metal layer of the cell region CELL to correspond to the lower metal pattern 652 formed on the uppermost metal layer of the peripheral circuit region PERI. Contacts may not be formed on the upper metal pattern 592 formed on the uppermost metal layer of the cell region CELL.

Figure 16:
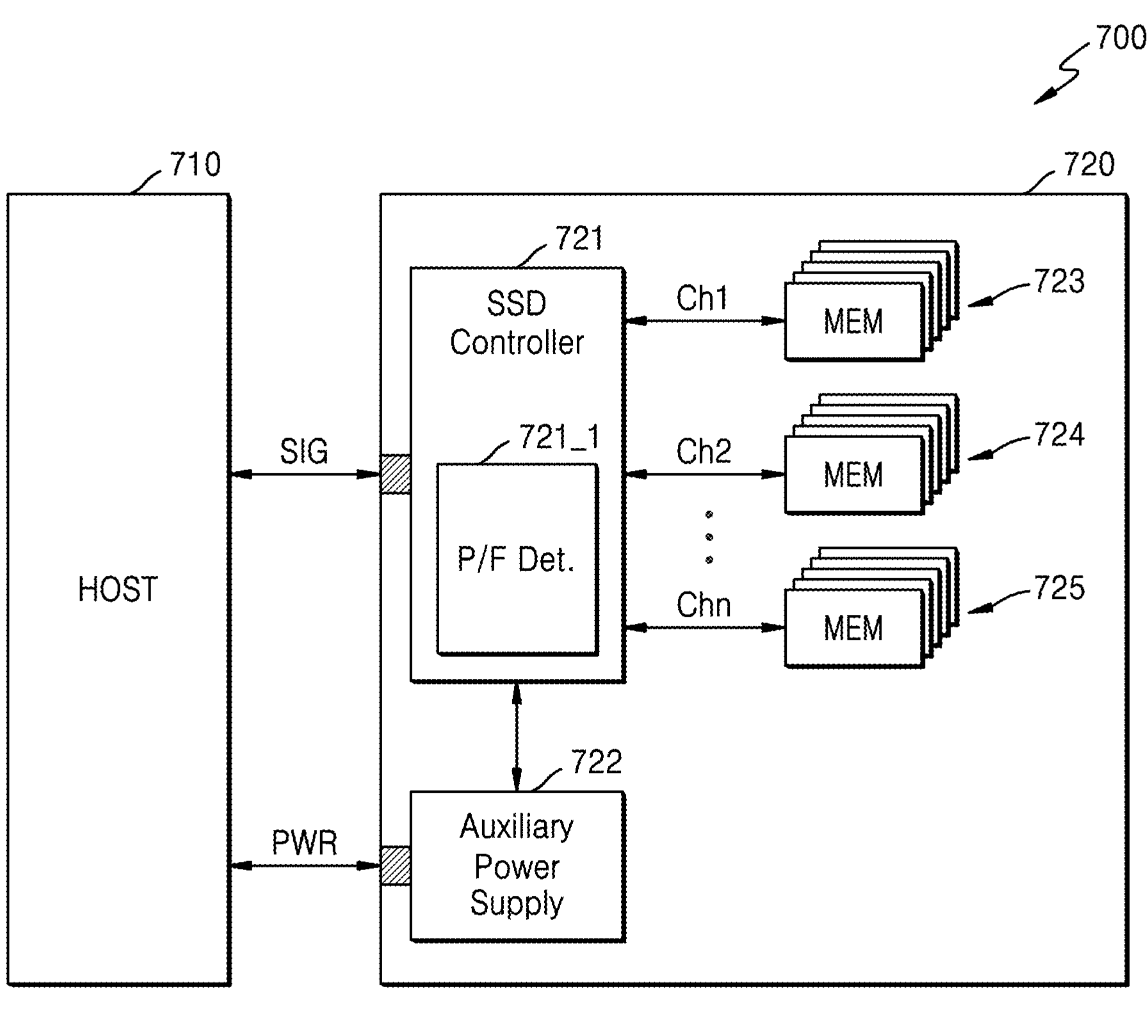
FIG. 16 is a block diagram illustrating a solid state drive (SSD) system to which a memory device according to an embodiment of the inventive concepts is applied.

FIG. 16 is a block diagram illustrating an SSD system 700 to which a memory device according to at least one embodiment of the inventive concepts is applied.

Referring to FIG. 16, an SSD system 700 may include a host 710 and an SSD 720. The SSD 720 may exchange signals with the host 710 through a signal connector and receives power through a power connector. The SSD 720 may include an SSD controller 721, an auxiliary power supply 722, and memory devices 723, 724, and 725. The memory devices 723, 724, and 725 may be vertically stacked NAND flash memory devices. In this case, the SSD 720 may be implemented by using the embodiments described above with reference to FIGS. 1 to 15. For example, the SSD controller 721 may include a pass/fail determiner 721_1 according to the embodiments described above, and a threshold voltage distribution of memory cells of the memory devices 723, 724, and 725 may be changed depending on the embodiments described above, based on a determination operation of the pass/fail determiner 721_1.

While the inventive concepts have been particularly shown and described with reference to some embodiments thereof, it will be understood that various changes in form and details may be made therein without departing from the spirit and scope of the following claims.

What is claimed is:

1. A memory device comprising:

a memory cell array including a plurality of memory cells;

a voltage generator configured to generate a program voltage and a verification voltage; and a control logic configured to control multiple program loops to program the plurality of memory cells, using the program voltage, to multiple program states during a data write operation and to determine, using the verification voltage, whether programming passes or fails in the multiple program loops, wherein the control logic is configured to control the multiple program loops to verify one or more (n+1)-th memory cells to be programmed to an (n+1)-th program state using a verification condition for verifying an n-th program state in at least one of the multiple program loops, wherein n is an integer greater than or equal to 1, wherein the multiple program loops include a first program loop to an A-th program loop, wherein A is an integer greater than or equal to 2, wherein whether the programming of the one or more (n+1)-th memory cells passes or fails during the first program loop to a B-th program loop is determined by using the verification voltage having a first level for verifying the n-th program state, wherein B is an integer greater than or equal to 1 and less than A, wherein the B-th program loop is a program loop wherein a verification of the programming of the one or more (n+1)-th memory cells to the n-th program state passes, wherein the memory device is configured to adjust the verification voltage from the first level to a second level based on the programming of the one or more (n+1)-th memory cells passing the verification using the verification voltage having the first level, and in a (B+1)-th program loop, whether the programming of the one or more (n+1)-th memory cells passes or fails is determined by using the verification voltage having the second level for verifying the (n+1)-th program state, and wherein the second level is different from the first level.

2. The memory device of claim 1, wherein the verification condition includes a verification level of the verification voltage, and the pass or fail of the programming of the one or more (n+1)-th memory cells, in at least one of the multiple program loops, is determined using the verification level for verifying the n-th program state.

3. The memory device of claim 1, wherein a first threshold voltage distribution, corresponding to the n-th program state, is adjacent to a second threshold voltage distribution, corresponding to the (n+1)-th program state, and a first threshold voltage level, corresponding to the (n+1)-th program state, is greater than a second threshold voltage level, corresponding to the n-th program state.

4. The memory device of claim 3, wherein, after programming of one or more n-th memory cells to the n-th program state, the one or more (n+1)-th memory cells are verified using a verification condition for verifying the (n+1)-th program state.

5. The memory device of claim 3, wherein, at a time before programming of one or more n-th memory cells to the n-th program state, the one or more (n+1)-th memory cells are verified using a verification condition for the (n+1)-th program state.

6. The memory device of claim 1, wherein a programming voltage of the (B+1)-th program loop is less than a programming voltage of the B-th program loop.

7. The memory device of claim 1, wherein a threshold voltage distribution of the one or more (n+1)-th memory cells has a distribution corresponding to the n-th program state through the first program loop to the B-th program loop, and the threshold voltage distribution of the one or more (n+1)-th memory cells is changed to a distribution corresponding to the (n+1)-th program state after the B-th program loop.

8. The memory device of claim 1, wherein the control logic is further configured to control the multiple program loops such that one or more (n+2)-th memory cells to be programmed to an (n+2)-th program state are verified using the verification condition for verifying the n-th program state.

9. The memory device of claim 1, wherein a threshold voltage distribution of the n-th program state is not adjacent to a threshold voltage distribution of the (n+1)-th program state, and at least one threshold voltage distribution is between the n-th program state and the (n+1)-th program state.

10. The memory device of claim 9, wherein the program voltage includes voltage pulses according to an incremental step pulse programming (ISPP) method, and levels of the voltage pulses continuously increase while performing program loops for programming the one or more (n+1)-th memory cells to the (n+1)-th program state.

* * * * *